United States Patent
Cheng et al.

(10) Patent No.: US 11,901,242 B2
(45) Date of Patent: Feb. 13, 2024

(54) GATE STRUCTURES FOR SEMICONDUCTOR DEVICES

(71) Applicant: Taiwan Semiconductor Manufacturing Co., Ltd., Hsinchu (TW)

(72) Inventors: Chung-Liang Cheng, Changhua County (TW); Ziwei Fang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 21 days.

(21) Appl. No.: 17/397,186

(22) Filed: Aug. 9, 2021

(65) Prior Publication Data

US 2021/0366785 A1 Nov. 25, 2021

Related U.S. Application Data

(63) Continuation of application No. 16/739,676, filed on Jan. 10, 2020, now Pat. No. 11,088,034.

(Continued)

(51) Int. Cl.
*H01L 21/8238* (2006.01)
*H01L 29/06* (2006.01)
(Continued)

(52) U.S. Cl.
CPC ......... *H01L 21/823842* (2013.01); *H01L 21/28088* (2013.01); *H01L 21/28556* (2013.01);
(Continued)

(58) Field of Classification Search
CPC ....... H01L 21/823842; H01L 21/28088; H01L 21/28556; H01L 21/32133;
(Continued)

(56) References Cited

U.S. PATENT DOCUMENTS 9,093,530 B2 7/2015 Huang et al.
9,171,929 B2 10/2015 Lee et al.
(Continued)

FOREIGN PATENT DOCUMENTS

KR 20150086165 A 7/2015
KR 20180060948 A 6/2018
(Continued)

OTHER PUBLICATIONS

Korean Notice of Allowance, dated Mar. 23, 2021, for Korean Intellectual Property Office Appl. No. 10-2020-0044723, 6 pages.

*Primary Examiner* — Tong-Ho Kim
(74) *Attorney, Agent, or Firm* — Sterne, Kessler, Goldstein & Fox P.L.L.C.

(57) ABSTRACT

The structure of a semiconductor device with different gate structures configured to provide ultra-low threshold voltages and a method of fabricating the semiconductor device are disclosed. The semiconductor device includes first and second nanostructured channel regions in first and second nanostructured layers, respectively, and first and second gate-all-around (GAA) structures surrounding the first and second nanostructured channel regions, respectively. The first GAA structure includes an Al-based gate stack with a first gate dielectric layer, an Al-based n-type work function metal layer, a first metal capping layer, and a first gate metal fill layer. The second GAA structure includes an Al-free gate stack with a second gate dielectric layer, an Al-free p-type work function metal layer, a metal growth inhibition layer, a second metal capping layer, and a second gate metal fill layer.

20 Claims, 28 Drawing Sheets

Related U.S. Application Data

(60) Provisional application No. 62/851,211, filed on May 22, 2019.

(51) Int. Cl.

| | | |
|---|---|---|
| *H01L 29/10* | (2006.01) | |
| *H01L 29/08* | (2006.01) | |
| *H01L 29/423* | (2006.01) | |
| *H01L 27/092* | (2006.01) | |
| *H01L 21/28* | (2006.01) | |
| *H01L 21/285* | (2006.01) | |
| *H01L 21/3213* | (2006.01) | |
| *H01L 29/49* | (2006.01) | |

(52) U.S. Cl.
CPC .. *H01L 21/32133* (2013.01); *H01L 21/32139* (2013.01); *H01L 21/823807* (2013.01); *H01L 21/823821* (2013.01); *H01L 27/0924* (2013.01); *H01L 29/0673* (2013.01); *H01L 29/0847* (2013.01); *H01L 29/1037* (2013.01); *H01L 29/42392* (2013.01); *H01L 29/4966* (2013.01)

(58) Field of Classification Search
CPC ....... H01L 21/32139; H01L 21/823807; H01L 21/823821; H01L 27/0924; H01L 29/0673; H01L 29/0847; H01L 29/1037; H01L 29/42392; H01L 29/4966; H01L 21/823456; H01L 27/092; H01L 29/0649; H01L 29/66439; H01L 29/66545; H01L 29/78696; H01L 21/8238; H01L 29/0665; H01L 29/4232; H01L 29/66772; H01L 29/78654
USPC ....................................................... 257/351
See application file for complete search history.

(56) References Cited

U.S. PATENT DOCUMENTS

| | | | |
|---|---|---|---|
| 9,214,555 B2 | 12/2015 | Oxland et al. | |
| 9,236,267 B2 | 1/2016 | De et al. | |
| 9,520,482 B1 | 12/2016 | Chang et al. | |
| 9,548,303 B2 | 1/2017 | Lee et al. | |
| 9,564,489 B2 | 2/2017 | Yeo et al. | |
| 9,576,814 B2 | 2/2017 | Wu et al. | |
| 9,583,362 B2 | 2/2017 | Ho et al. | |
| 9,601,342 B2 | 3/2017 | Lee et al. | |
| 9,608,116 B2 | 3/2017 | Ching et al. | |
| 9,847,391 B1 | 12/2017 | Zang et al. | |
| 10,157,987 B1 | 12/2018 | Liaw | |
| 10,319,646 B2 | 6/2019 | Radosavljevic et al. | |
| 10,438,851 B2 | 10/2019 | Chiang et al. | |
| 11,088,034 B2 * | 8/2021 | Cheng | H01L 21/28088 |
| 2017/0162447 A1 | 6/2017 | Glass et al. | |
| 2017/0162575 A1 | 6/2017 | Li | |
| 2017/0263704 A1 | 9/2017 | Kittl et al. | |
| 2018/0331232 A1 | 11/2018 | Frougier et al. | |
| 2019/0051734 A1 | 2/2019 | Lin et al. | |
| 2019/0097055 A1 | 3/2019 | Dewey et al. | |
| 2019/0131185 A1 | 5/2019 | Huang et al. | |
| 2020/0083339 A1 | 3/2020 | Cheng et al. | |
| 2020/0251593 A1 * | 8/2020 | Miao | H01L 21/823412 |
| 2020/0373206 A1 | 11/2020 | Cheng et al. | |

FOREIGN PATENT DOCUMENTS

| | | |
|---|---|---|
| TW | 201403792 A | 1/2014 |
| TW | 201703201 A | 1/2017 |
| TW | 201806149 A | 1/2018 |
| TW | 201901960 A | 1/2019 |

* cited by examiner

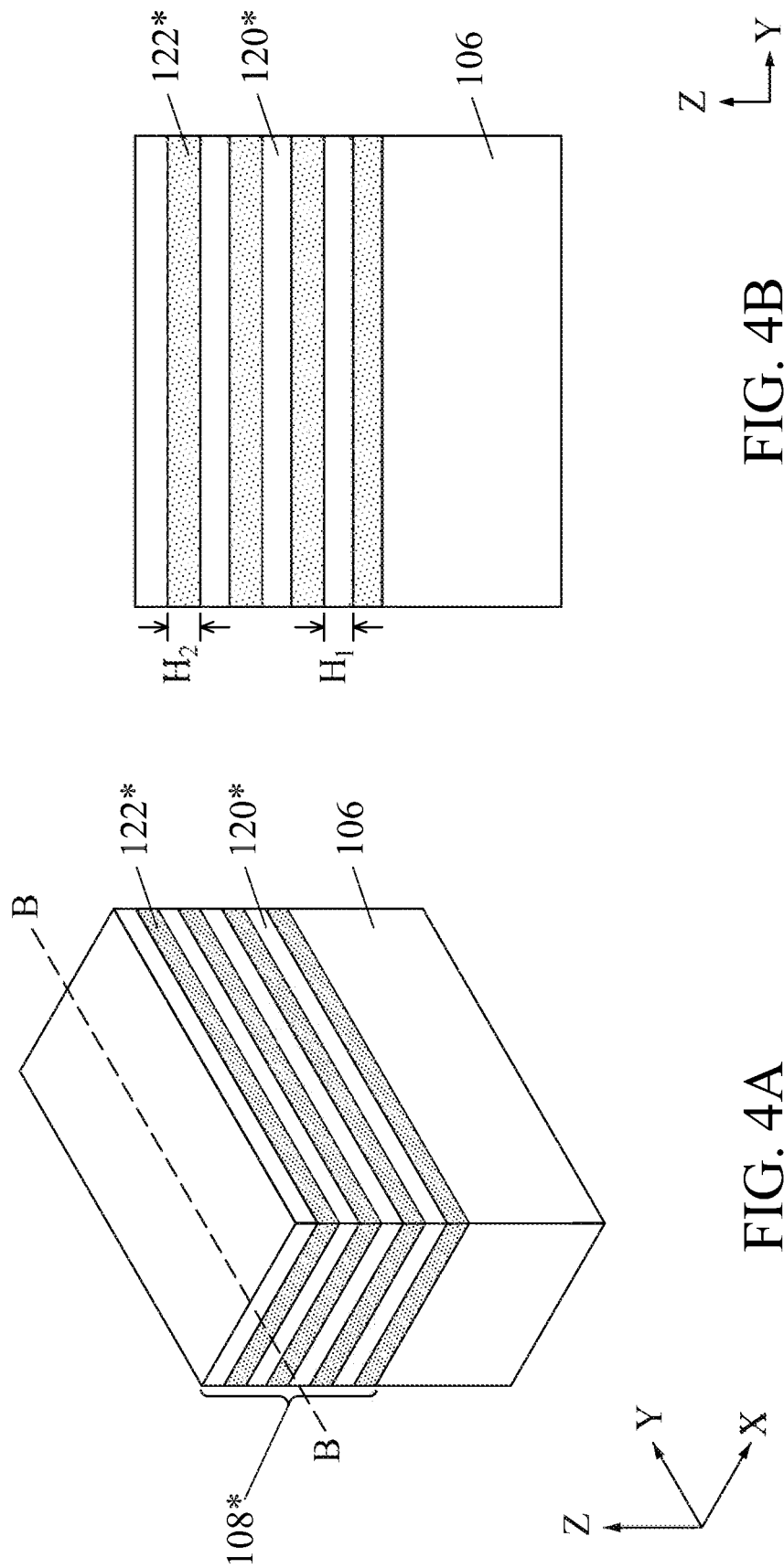

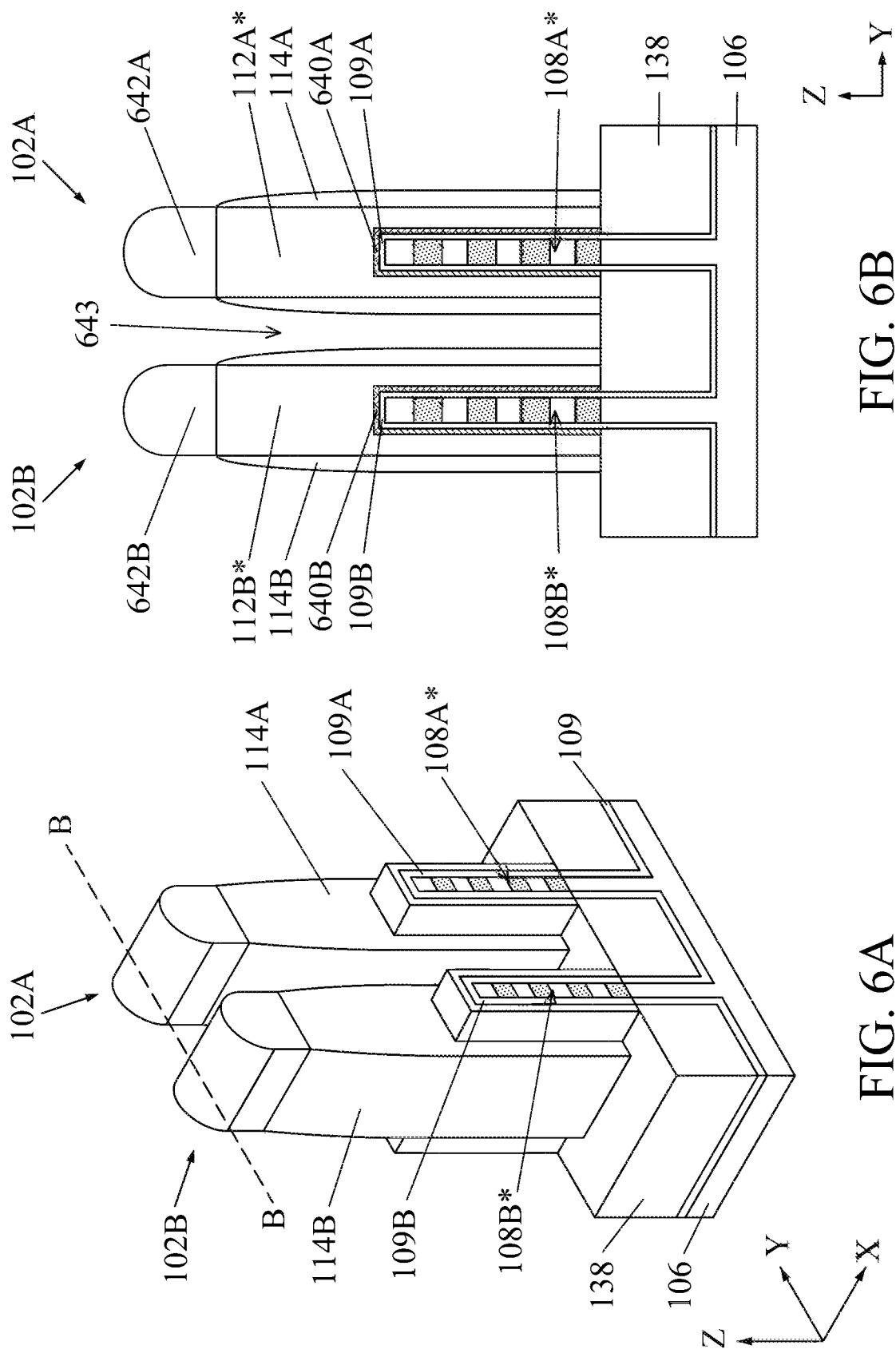

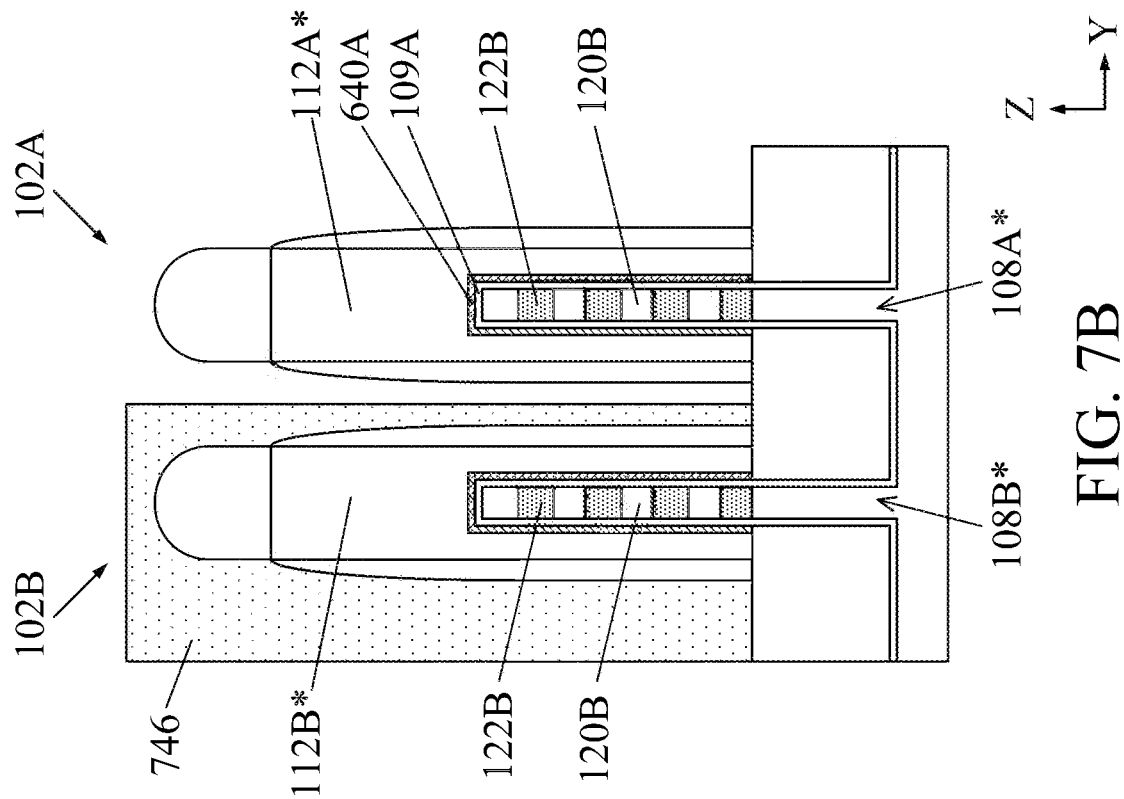
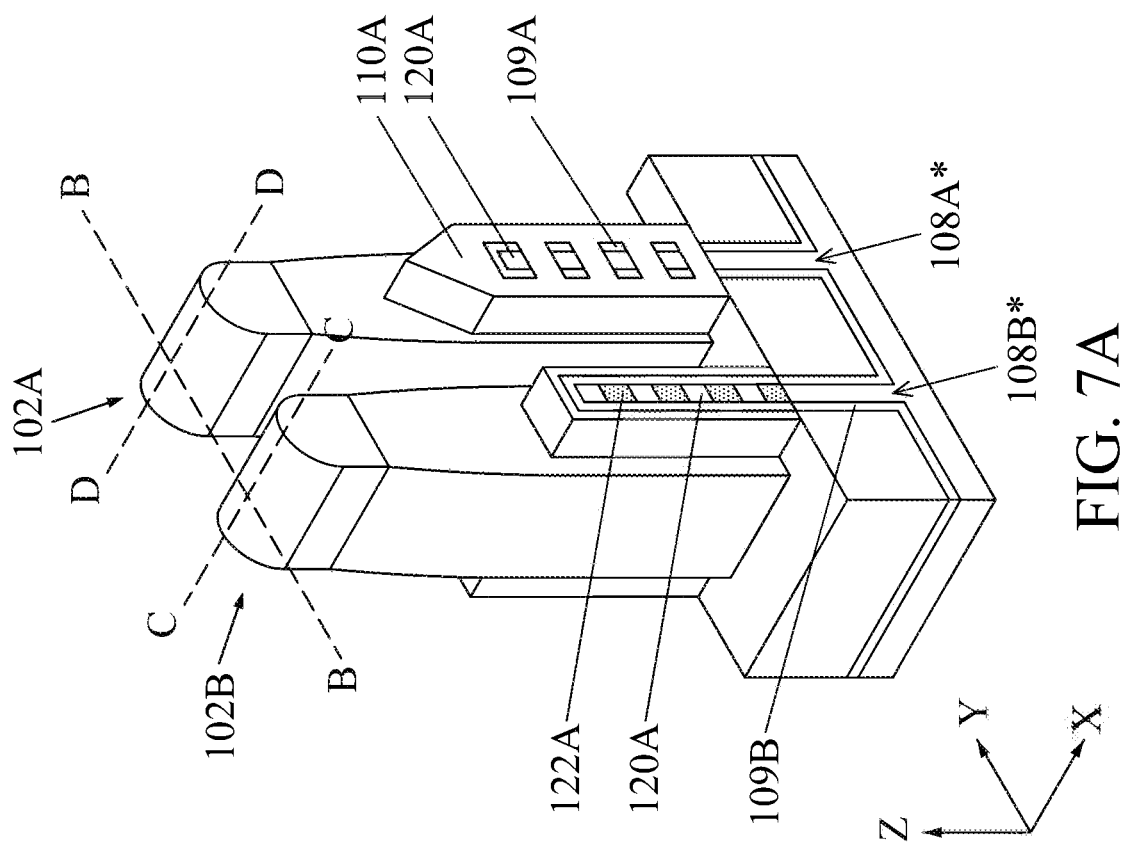
FIG. 7B
FIG. 7A

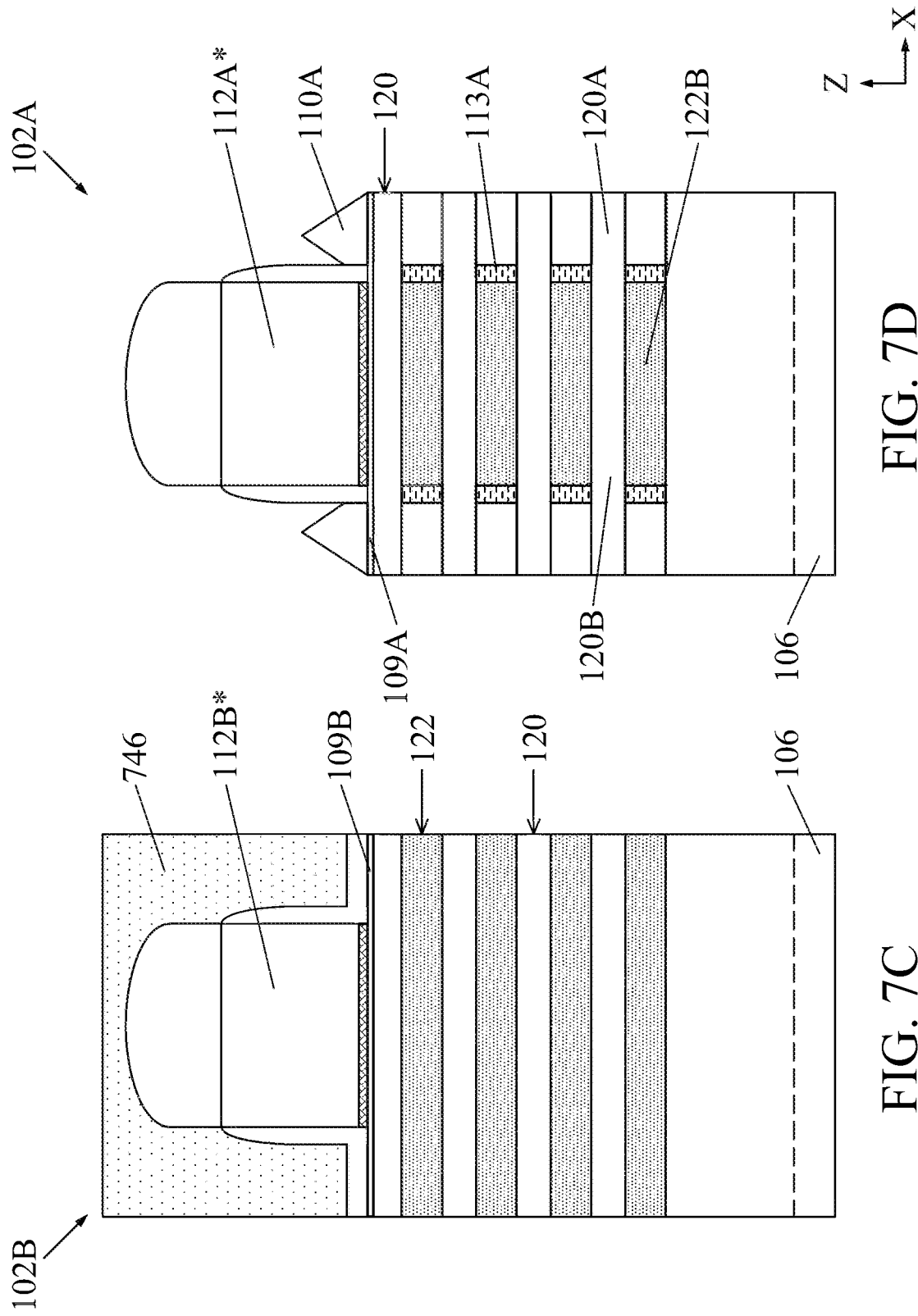

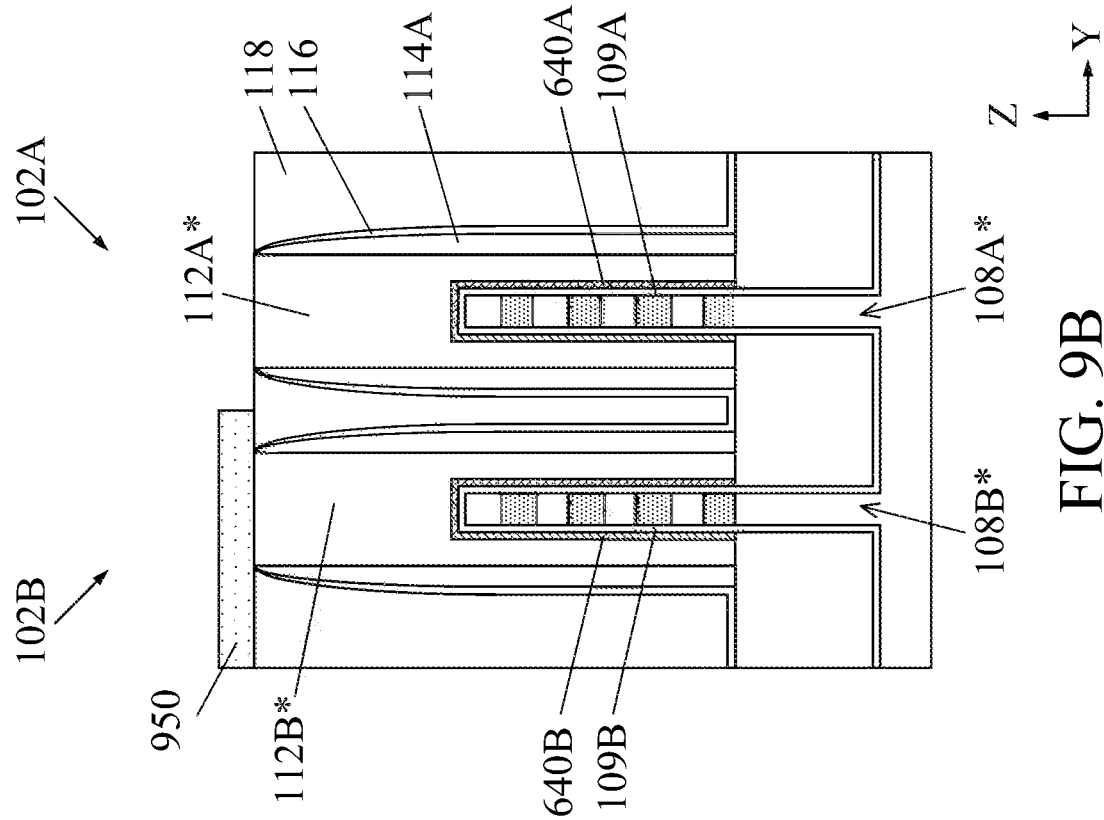
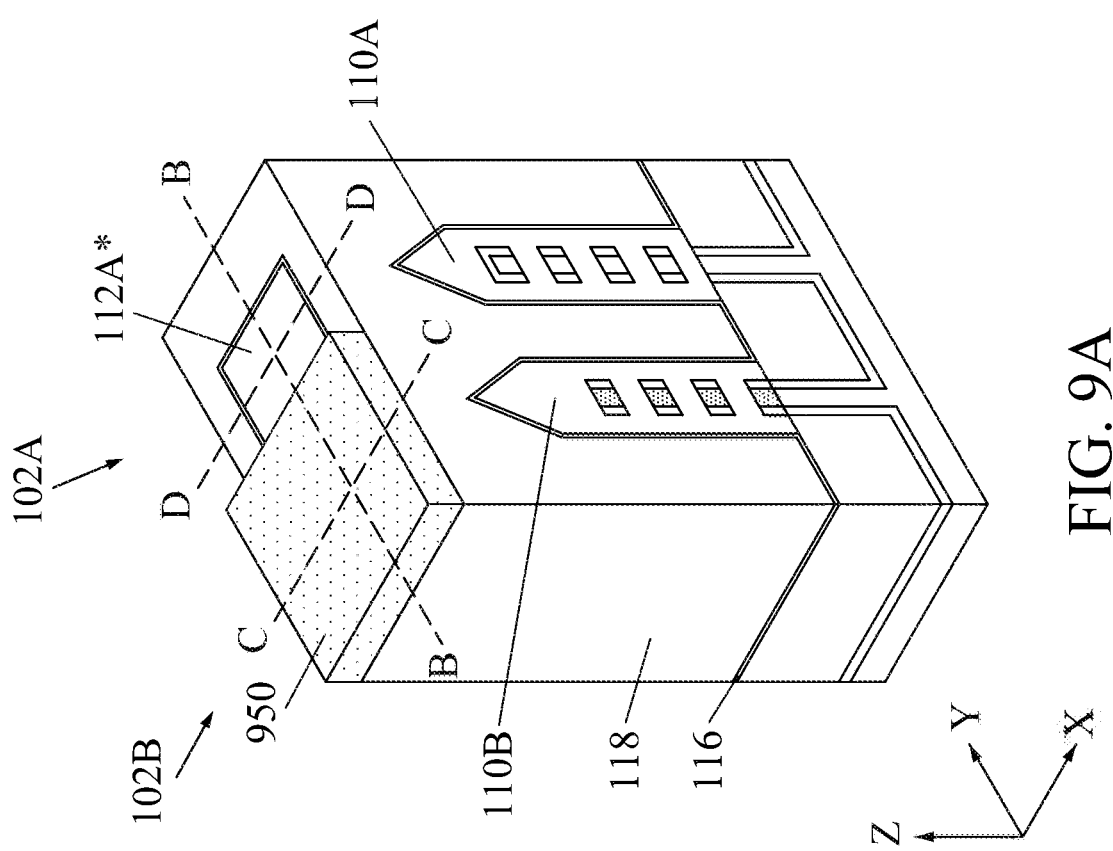
FIG. 9A
FIG. 9B

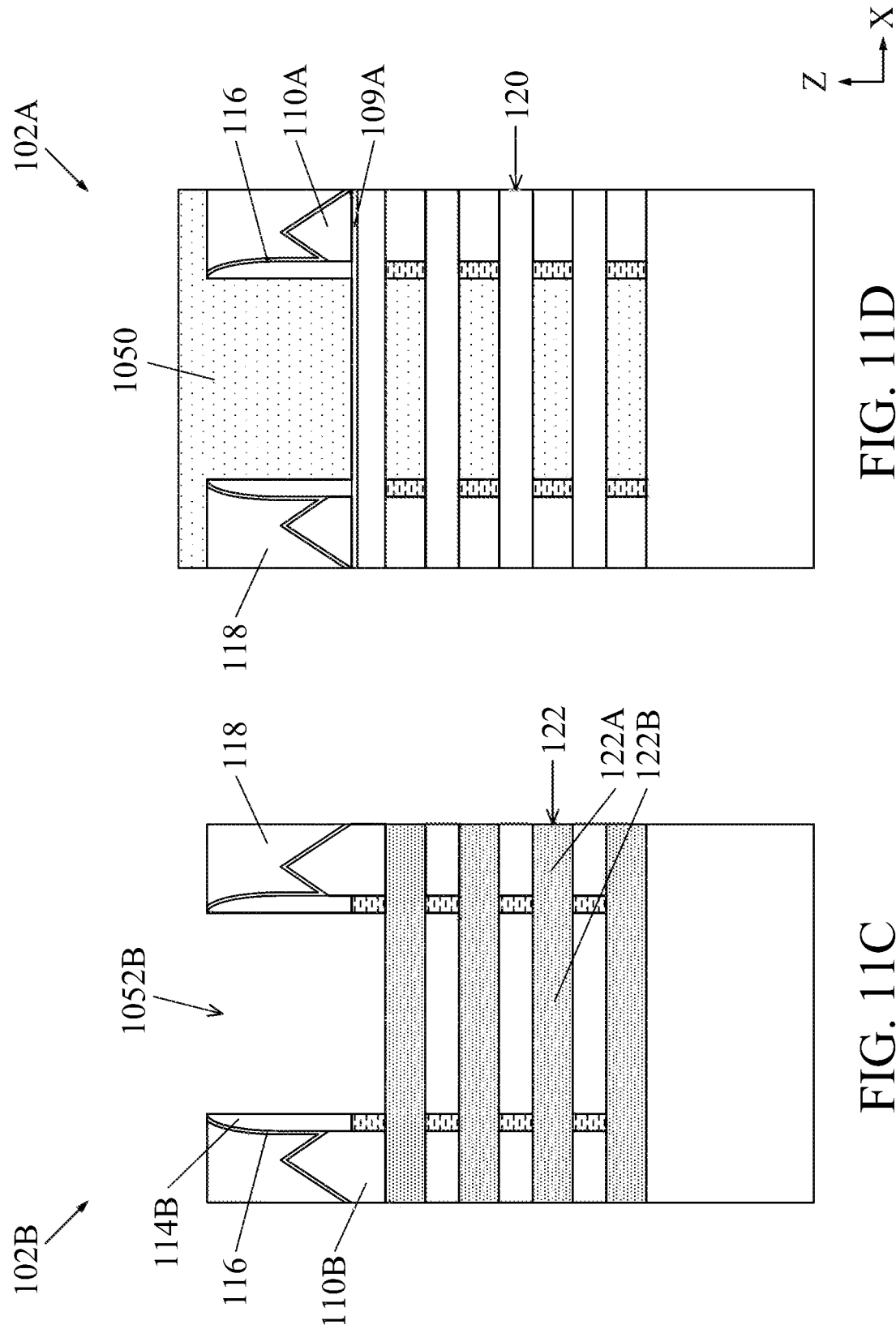

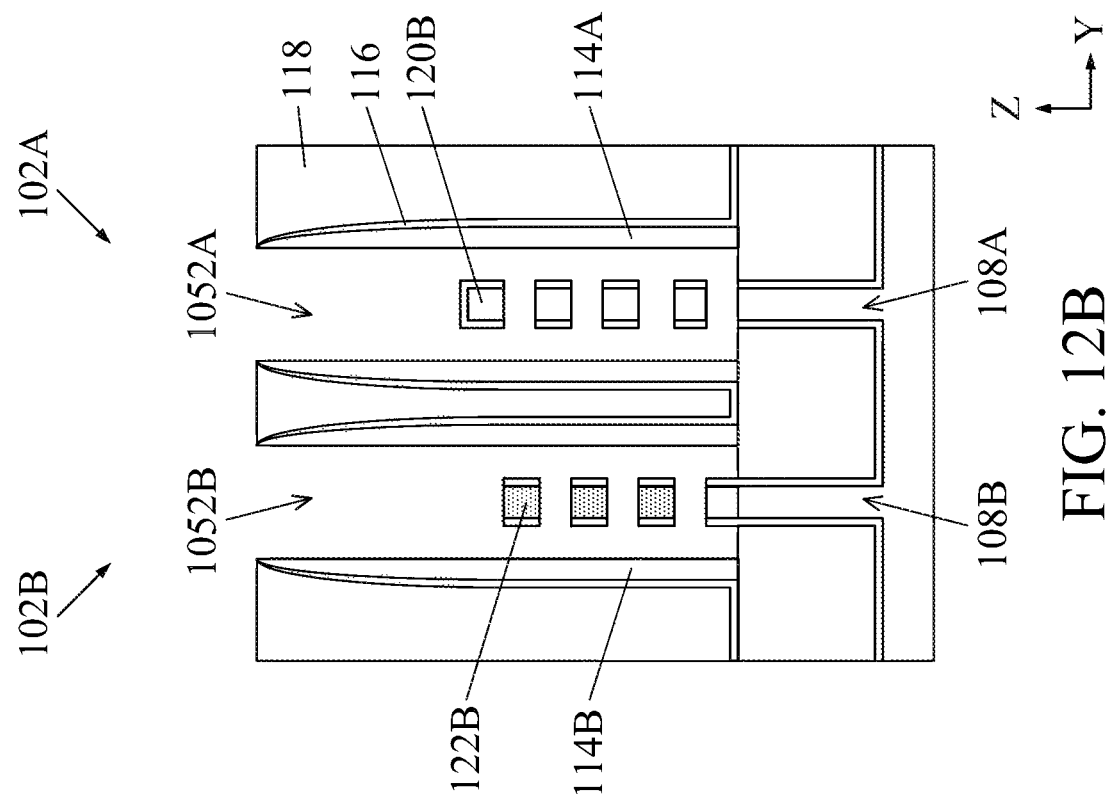
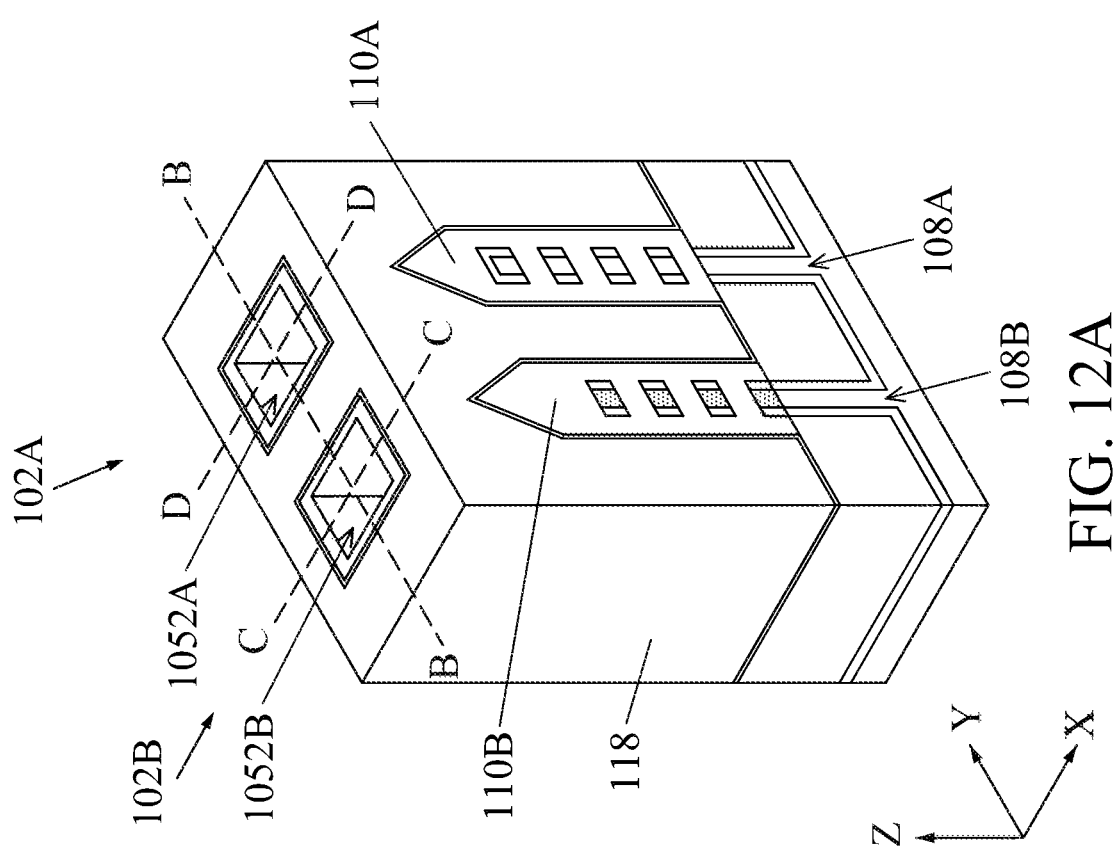
FIG. 12A
FIG. 12B

GATE STRUCTURES FOR SEMICONDUCTOR DEVICES

CROSS-REFERENCE TO RELATED APPLICATIONS

This application is a continuation of U.S. patent application Ser. No. 16/739,676, titled "Gate Structures for Semiconductor Devices," filed Jan. 10, 2020, which claims the benefit of U.S. Provisional Patent Application No. 62/851,211, titled "Gate Structures for Ultra-Low Threshold Voltage Tuning of FinFET and Gate-All-Around (GAA) FET," filed May 22, 2019, each of which is incorporated by reference herein in its entirety.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and fin field effect transistors (finFETs). Such scaling down has increased the complexity of semiconductor manufacturing processes.

BRIEF DESCRIPTION OF THE DRAWINGS

Aspects of this disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

FIGS. 4A-12A illustrate isometric views of a semiconductor device with different gate structures at various stages of its fabrication process, in accordance with some embodiments.

FIGS. 4B-18B, 7C-12C, 7D-12D, and 13A-18A illustrate cross-sectional views of a semiconductor device with different gate structures at various stages of its fabrication process, in accordance with some embodiments.

Illustrative embodiments will now be described with reference to the accompanying drawings. In the drawings, like reference numerals generally indicate identical, functionally similar, and/or structurally similar elements.

DETAILED DESCRIPTION

Figure 1A:
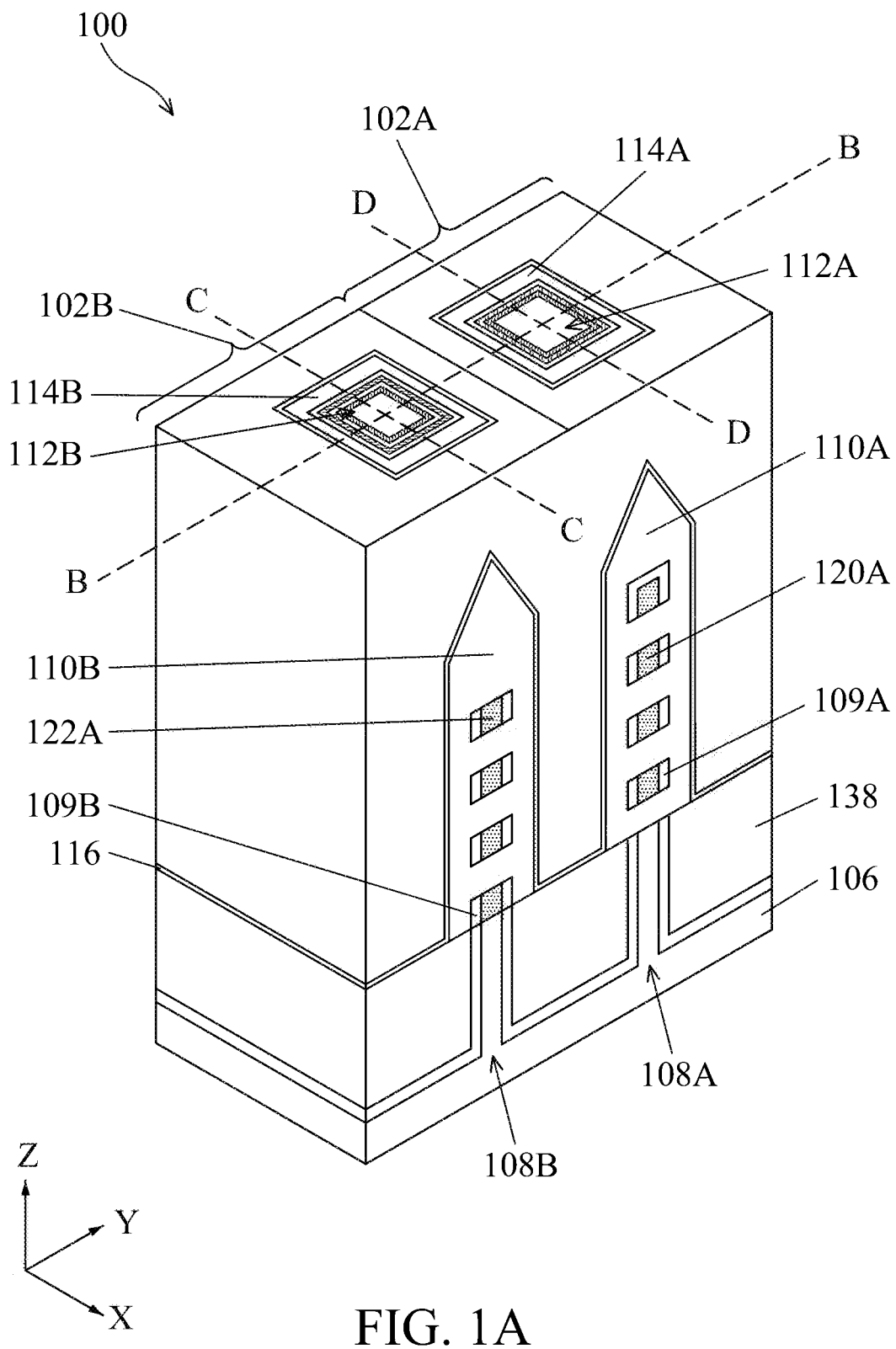
FIGS. 1A and 1B-1D illustrate an isometric view and cross-sectional views of a semiconductor device with different gate structures, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the process for forming a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

As used herein, the term "etch selectivity" refers to the ratio of the etch rates of two different materials under the same etching conditions.

As used herein, the term "deposition selectivity" refers to the ratio of the deposition rates on two different materials or surfaces under the same deposition conditions.

As used herein, the term "high-k" refers to a high dielectric constant. In the field of semiconductor device structures and manufacturing processes, high-k refers to a dielectric constant that is greater than the dielectric constant of $SiO_2$ (e.g., greater than 3.9).

As used herein, the term "p-type" defines a structure, layer, and/or region as being doped with p-type dopants, such as boron.

As used herein, the term "n-type" defines a structure, layer, and/or region as being doped with n-type dopants, such as phosphorus.

As used herein, the term "nanostructured" defines a structure, layer, and/or region as having a horizontal dimension (e.g., along an X- and/or Y-axis) and/or a vertical dimension (e.g., along a Z-axis) less than, for example, 100 nm.

As used herein, the term "n-type work function metal (nWFM)" defines a metal or a metal-containing material with a work function value closer to a conduction band energy than a valence band energy of a material of a FET channel region. In some embodiments, the term "n-type work function metal (nWFM)" defines a metal or a metal-containing material with a work function value less than 4.5 eV.

As used herein, the term "p-type work function metal (pWFM)" defines a metal or a metal-containing material with a work function value closer to a valence band energy than a conduction band energy of a material of a FET channel region. In some embodiments, the term "p-type work function metal (pWFM)" defines a metal or a metal-containing material with a work function value equal to or greater than 4.5 eV.

In some embodiments, the terms "about" and "substantially" can indicate a value of a given quantity that varies within 5% of the value (e.g., ±1%, ±2%, ±3%, ±4%, ±5% of the value).

The fin structures disclosed herein may be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

The required gate voltage—the threshold voltage Vt—to turn on a field effect transistor (FET) can depend on the semiconductor material of the FET channel region and the work function values of the stack of layers (also referred to as a "gate stack") included in a gate structure of the FET. For example, for an n-type FET (NFET), reducing the difference between the work function value of the NFET gate stack and the conduction band energy of the material (e.g., 4.1 eV for Si or 3.8 eV for SiGe) of the NFET channel region can reduce the NFET threshold voltage. For a p-type FET (PFET), reducing the difference between the work function value of the PFET gate stack and the valence band energy of the material (e.g., 5.2 eV for Si or 4.8 eV for SiGe) of the PFET channel region can reduce the PFET threshold voltage. The work function values of the FET gate stacks can depend on the thickness and/or material composition of each of the layers of the FET gate stacks. As such, FETs can be manufactured with different threshold voltages by adjusting the thickness and/or material composition of the gate stack layers.

Due to the increasing demand for low power portable devices, there is an increasing demand for FETs with low threshold voltages, such as threshold voltages lower than 100 mV (also referred to as "ultra-low threshold voltage"). One way to achieve such ultra-low threshold voltage in FETs can be by using work function metal (WFM) layers with thicknesses greater than about 4 nm (e.g., about 5 nm to about 10 nm) in the gate stacks. However, the thickness of the WFM layer(s) in the gate stacks can be constrained by the gate stack geometries of the FETs. For example, in gate-all-around (GAA) FETs, the thickness of the WFM layer(s) can be constrained by the spacing between the nanostructured channel regions of the GAA FETs. Also, depositing such thick WFM layer(s) can become increasingly challenging with the continuous scaling down of FETs (e.g., GAA FETs).

The present disclosure provides example structures of FETs (e.g., finFETs or GAA FETs) with different gate structures configured to provide ultra-low threshold voltages and example methods of forming such FETs on a same substrate. The example methods form FETs of different conductivity types with different work function values, and as a result, with different and/or ultra-low threshold voltages on the same substrate. These example methods can be less complicated and more cost-effective in manufacturing reliable gate structures in FETs with nanostructured channel regions and with ultra-low threshold voltages than other methods of forming FETs with similar channel dimensions and threshold voltages on the same substrate. In addition, these example methods can form FET gate structures with smaller dimensions (e.g., thinner gate stacks) than other methods of forming FETs with similar threshold voltages. For example, using these example methods, the thicknesses of gate stack layers can be reduced by about 50% to about 75% compared to the thicknesses of gate stack layers formed using the other methods.

In some embodiments, NFETs and PFETs with different gate stack layer configurations can be selectively formed on the same substrate. To achieve NFETs and PFETs with ultra-low threshold voltages, NFETs and PFETs can include Al-based NFET gate stacks and substantially Al-free (e.g., with no Al) PFET gate stacks, respectively. The NFET and PFET gate stacks can have n-type WFM (nWFM) layer(s) and p-type WFM (pWFM) layer(s) in physical contact with gate dielectric layers of the NFETs and PFETs, respectively. The NFET gate stacks can include Al-based nWFM layers (e.g., Al-based titanium (Ti) or tantalum (Ta) alloys) and the PFET gate stacks can include substantially Al-free (e.g., with no Al) pWFM (e.g., Al-free Ti or Ta nitrides or alloys) with thicknesses smaller than 3 nm (e.g., about 0.5 nm to about 3 nm) to achieve ultra-low threshold voltages. In some embodiments, PFET gate stacks can have metal growth inhibition layers configured to inhibit the deposition of Al-based layers in PFET gate stacks during the formation of the Al-based nWFM layers in NFET gate stacks. As such, the inhibition layers can prevent the PFET gate stacks from being contaminated with Al atoms, which can decrease the work function values of the pWFM layers and increase PFET threshold voltage. In some embodiments, the NFET gate structures can have metal capping layers on the Al-based nWFM layers. The metal capping layers can prevent the oxidation of the Al-based nWFM layers and as a result, prevent an increase in work function values of the Al-based nWFM layers and an increase in NFET threshold voltage.

Figure 1B:
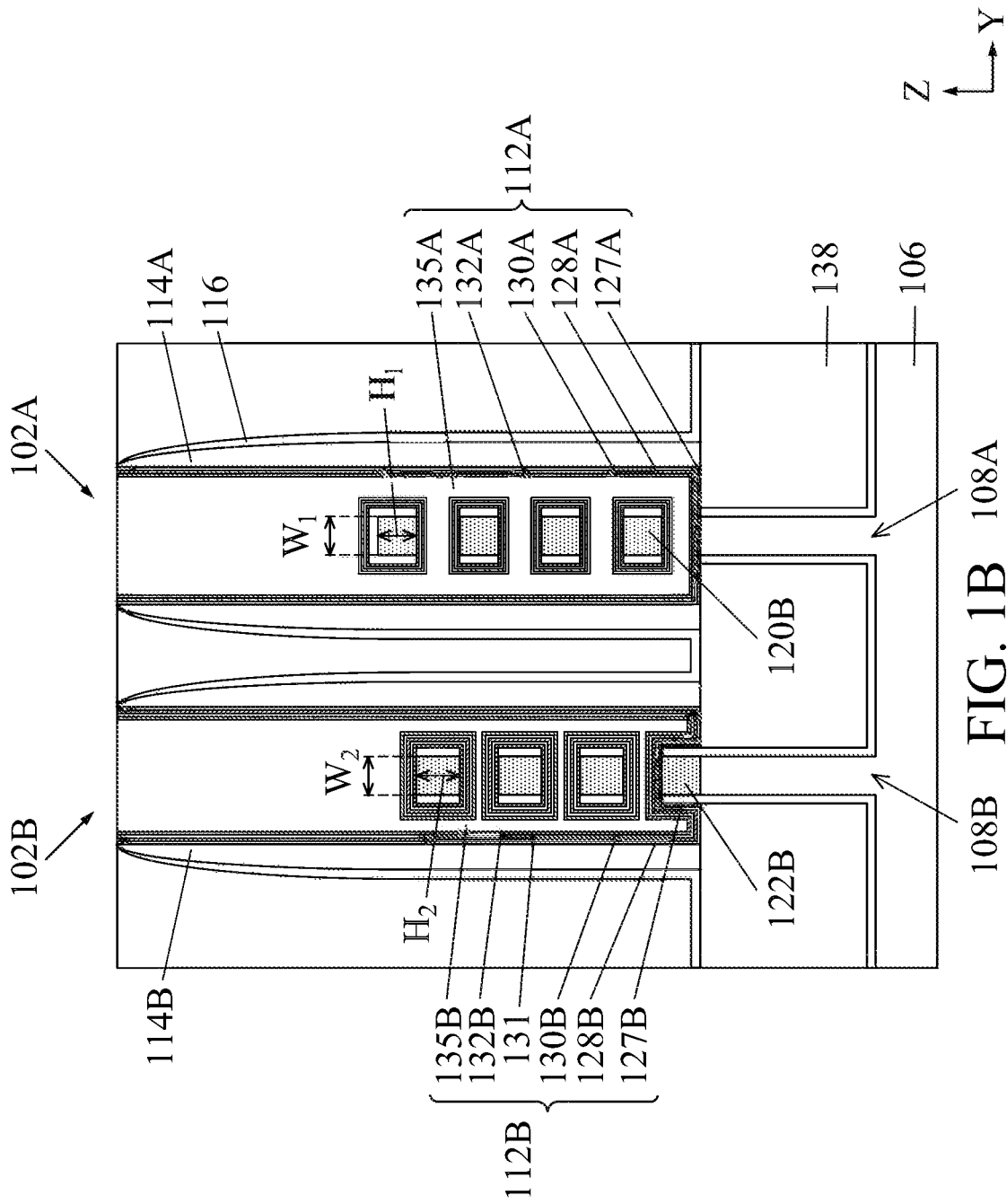
Figure 1C:
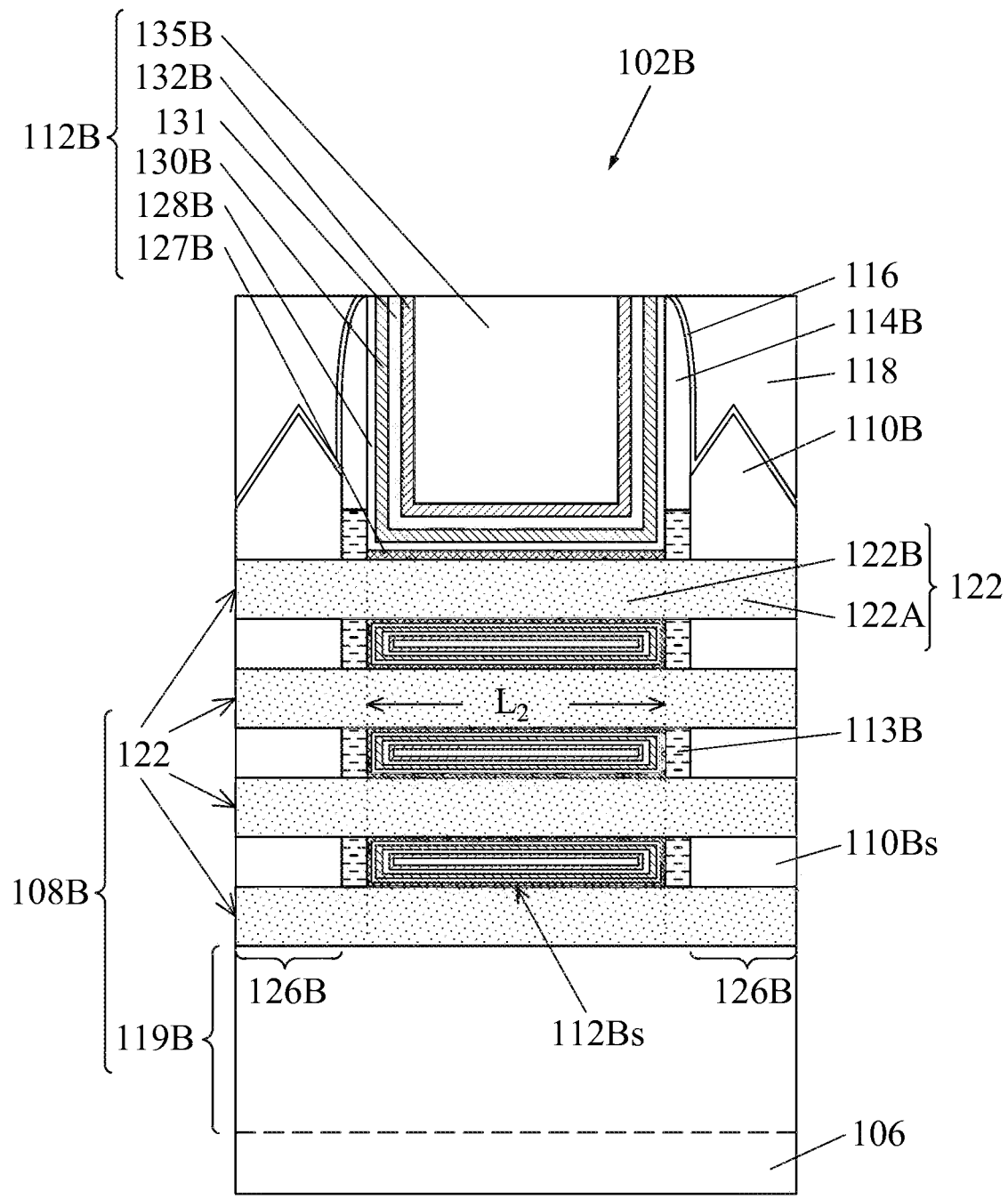
Figure 1D:
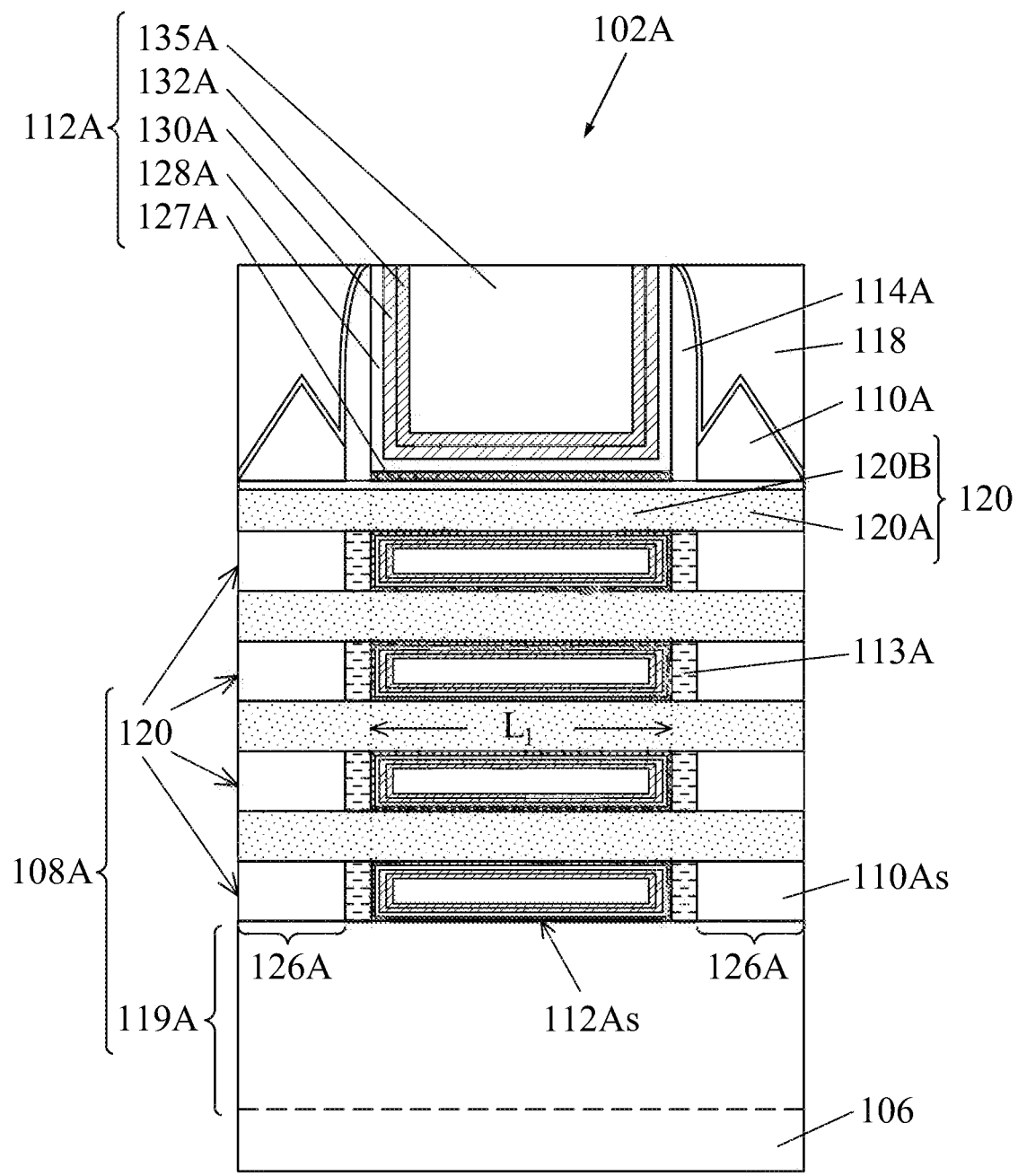

A semiconductor device 100 having FETs 102A-102B is described with reference to FIGS. 1A-1D, according to some embodiments. FIG. 1A illustrates an isometric view of semiconductor device 100, according to some embodiments. FIGS. 1B-1D illustrate cross-sectional views along lines B-B, C-C, and D-D of semiconductor device 100 of FIG. 1A, respectively, according to some embodiments. In some embodiments, FETs 102A-102B can be NFET and PFET, respectively. Even though two FETs are discussed with reference to FIGS. 1A-1D, semiconductor device 100 can have any number of FETs. The discussion of elements of FETs 102A-102B with the same annotations applies to each other, unless mentioned otherwise. The isometric view and cross-sectional views of semiconductor device 100 are shown for illustration purposes and may not be drawn to scale.

Referring to FIGS. 1A-1D, FETs 102A-102B can be formed on a substrate 106. Substrate 106 can be a semiconductor material such as, but not limited to, silicon. In some embodiments, substrate 106 can include a crystalline silicon substrate (e.g., wafer). In some embodiments, substrate 106 can include (i) an elementary semiconductor, such as germanium (Ge); (ii) a compound semiconductor including silicon carbide (SiC), silicon arsenide (SiAs), gallium arsenide (GaAs), gallium phosphide (GaP), indium phosphide (InP), indium arsenide (InAs), indium antimonide (InSb), and/or a III-V semiconductor material; (iii) an alloy semiconductor including silicon germanium (SiGe), silicon germanium carbide (SiGeC), germanium stannum (GeSn), silicon germanium stannum (SiGeSn), gallium arsenic phosphide (GaAsP), gallium indium phosphide (GaInP), gallium indium arsenide (GaInAs), gallium indium arsenic phosphide (GaInAsP), aluminum indium arsenide (AlAs), and/or aluminum gallium arsenide (AlGaAs); (iv) a silicon-on-insulator (SOI) structure; (v) a silicon germanium (SiGe)-on insulator structure (SiGeOI); (vi) germanium-on-insulator (GeOI) structure; or (vii) a combination thereof. Further, substrate 106 can be doped depending on design requirements (e.g., p-type substrate or n-type substrate). In some embodiments, substrate 106 can be doped with p-type dopants (e.g., boron, indium, aluminum, or gallium) or n-type dopants (e.g., phosphorus or arsenic).

FETs 102A-102B can include fin structures 108A-108B, passivation layers 109A-109B, epitaxial fin regions 110A-110B, gate structures 112A-112B (also referred to as "gate-all-around (GAA) structures 112A-112B"), inner spacers 113A-113B, and outer spacers 114A-114B, respectively.

As shown in FIGS. 1B-1D, fin structure 108A can include a fin base portion 119A and a stack of first semiconductor layers 120 disposed on fin base portion 119A and fin structure 108B can include a fin base portion 119B and a stack of second semiconductor layers 122. In some embodiments, fin base portions 119A-119B can include material similar to substrate 106. Fin base portions 119A-119B can be formed from photolithographic patterning and etching of substrate 106. First and second semiconductor layers 120 and 122 can include semiconductor materials different from each other. In some embodiments, first and second semiconductor layers 120 and 122 can include semiconductor materials with oxidation rates and/or etch selectivity different from each other. In some embodiments, first and second semiconductor layers 120 and 122 can include semiconductor materials similar to or different from substrate 106. First and second semiconductor layers 120 and 122 can include (i) an elementary semiconductor, such as silicon or germanium; (ii) a compound semiconductor including a III-V semiconductor material; (iii) an alloy semiconductor including SiGe, germanium stannum, or silicon germanium stannum; or (iv) a combination thereof.

In some embodiments, first and second semiconductor layers 120 and 122 can include SiGe with Ge in a range from about 25 atomic percent to about 50 atomic percent with any remaining atomic percent being Si or can include Si without any substantial amount of Ge (e.g., with no Ge). The semiconductor materials of first and/or second semiconductor layers 120 and 122 can be undoped or can be in-situ doped during their epitaxial growth process using: (i) p-type dopants, such as boron, indium, or gallium; and/or (ii) n-type dopants, such as phosphorus or arsenic. In some embodiments, first semiconductor layers 120 can include Si, SiAs, silicon phosphide (SiP), SiC, or silicon carbon phosphide (SiCP) for n-type FET 102A and second semiconductor layers 122 can include SiGe, silicon germanium boron (SiGeB), germanium boron (GeB), silicon germanium stannum boron (SiGeSnB), or a III-V semiconductor compound for p-type FET 102A. In some embodiments, both first and second semiconductor layers 120 and 122 can include Si, SiAs, SiP, SiC, or SiCP for n-type FETs 102A-102B or SiGe, SiGeB, GeB, SiGeSnB or a III-V semiconductor compound for p-type FETs 102A-102B. In some embodiments, first and second semiconductor layers 120 and 122 can include materials similar to each other for NFET and PFET 102A-102B.

Each of first semiconductor layers 120 can have (i) nanostructured regions 120A wrapped around by epitaxial fin regions 110A and underlying inner and outer spacers 113A-114A (FIGS. 1A and 1D), and (ii) nanostructured channel regions 120B wrapped around by gate structure 112A (FIGS. 1B and 1D). Similarly, each of second semiconductor layers 122 can have (i) nanostructured regions 122A wrapped around by epitaxial fin regions 110B and underlying inner and outer spacers 113B-114B (FIGS. 1A and 1C), and (ii) nanostructured channel regions 122B wrapped around by gate structure 112B (FIGS. 1B and 1C).

Referring to FIG. 1B, nanostructured channel regions 120B and 122B can have respective vertical dimensions $H_1$ and $H_2$ (e.g., thickness or diameter) along a Z-axis ranging from about 5 nm to about 12 nm and respective horizontal dimensions $W_1$ and $W_2$ (e.g., width or diameter) along a Y-axis ranging from about 5 nm to about 30 nm. The ratios of $H_1/W_1$ and $H_2/W_2$ can each range from about 0.2 to about 5. Though rectangular cross-sections of nanostructured channel regions 120B and 122B are shown in FIG. 1B, nanostructured channel regions 120B and 122B can have cross-sections of other geometric shapes (e.g., circular, elliptical, triangular, or polygonal). Further, nanostructured channel regions 120B and 122B can have respective horizontal dimensions $L_1$ (FIG. 1D) and $L_2$ (FIG. 1C) along an X-axis ranging from about 10 nm to about 100 nm. The ratios of $L_1/H_1$ and $L_2/H_2$ can range from about 2 to about 20. In some embodiments, dimensions $H_1$ and $H_2$, $W_1$ and $W_2$, and $L_1$ and $L_2$ can be equal to or different from each other, respectively. In some embodiments, the ratios of $H_1/W_1$ and $H_2/W_2$, and $L_1/H_1$ and $L_2/H_2$ can be equal to or different from each other, respectively.

Referring to FIGS. 1A-1B, passivation layers 109A-109B can be disposed on sidewalls of nanostructured channel regions 120B and 122B and on sidewalls of fin base portions 119 and 121, respectively. In some embodiments, passivation layer 109A can be disposed on top surface of the top most nanostructured channel region 120B, as shown in FIG. 1D. In some embodiments, passivation layers 109A-109B can be a nitride, oxide, fluoride, chloride, and/or sulfide film.

Figure 2B:
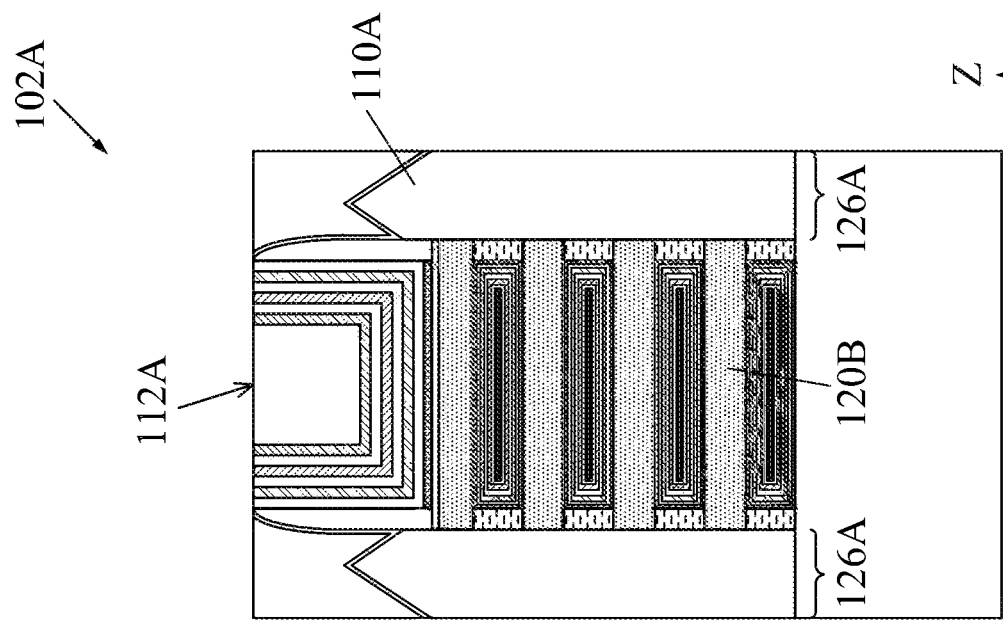
FIGS. 2A-2B illustrate cross-sectional views of different configurations of a semiconductor device, in accordance with some embodiments.
Figure 2A:
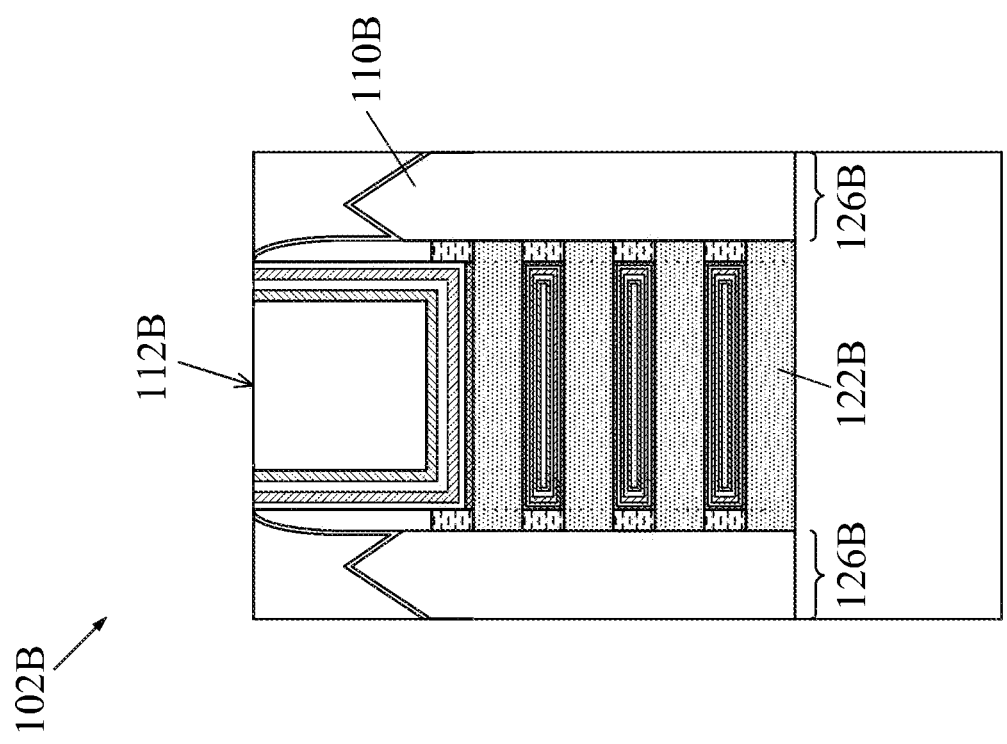

Referring to FIGS. 1A and 1C-1D, epitaxial fin regions 110A can be grown wrapped around nanostructured regions 120A that are not under inner or outer spacers 113A-114A. Similarly, epitaxial fin regions 110B can be grown wrapped around nanostructured regions 122A that are not under inner or outer spacers 113B-114B. In some embodiment, as shown in FIGS. 2A-2B, epitaxial fin regions 110B-110A can be grown on fin base portions 119B-119A, instead of being wrapped around nanostructured regions 122A and 120A, respectively. Epitaxial fin regions 110A-110B can include epitaxially-grown semiconductor materials similar to or different from each other. In some embodiments, the epitaxially-grown semiconductor material can include the same material or a different material from the material of substrate 106. Epitaxial fin regions 110A-110B can each have a thickness along sidewalls of respective nanostructured regions 120A and 122A ranging from about 3 nm to about 6 nm. Though triangular cross-sections of epitaxial fin regions 110A-110B are shown in FIGS. 1C-1D, epitaxial fin regions 110A-10B can have cross-sections of other geometric shapes (e.g., rectangular, semicircular, or polygonal).

Epitaxial fin regions 110A-110B can be n- and p-type, respectively. P-type epitaxial fin regions 110B can include SiGe, SiGeB, GeB, SiGeSnB, a III-V semiconductor compound, or a combination thereof and a dopant concentration ranging from about $1\times10^{20}$ atoms/cm$^3$ to about $1\times10^{21}$ atoms/cm$^3$. In some embodiments, each of p-type epitaxial fin regions 110B can have a plurality of sub-regions (not shown) that can include SiGe and can differ from each other based on, for example, doping concentration, epitaxial growth process conditions and/or relative concentration of Ge with respect to Si. Each of the sub-regions can have thicknesses similar to or different from each other and thicknesses can range from about 0.5 nm to about 5 nm. In some embodiments, the atomic percent Ge in a first sub-region can be smaller than the atomic percent Ge in a second sub-region. In some embodiments, the first sub-region can include Ge in a range from about 15 atomic percent to about 35 atomic percent, while the second sub-region can include Ge in a range from about 25 atomic percent to about 50 atomic percent with any remaining atomic percent being Si in the sub-regions.

The plurality of sub-regions of p-type epitaxial fin regions 110B can have varying p-type dopant concentrations with respect to each other, according to some embodiments. For example, the first sub-region can be undoped or can have a dopant concentration lower (e.g., dopant concentration less than about $8\times10^{20}$ atoms/cm$^3$) than the dopant concentration (e.g., dopant concentration in a range from about $1\times10^{20}$ to about $3\times10^{22}$ atoms/cm$^3$) of the second sub-region.

In some embodiments, n-type epitaxial fin regions 110A can have a plurality of n-type sub-regions (not shown). First n-type sub-regions can have materials with SiAs, SiC, or SiCP, a dopant concentration ranging from about $1\times10^{20}$ atoms/cm$^3$ to about $1\times10^{21}$ atoms/cm$^3$ and a thickness ranging from about 1 nm to about 3 nm. Second n-type sub-regions disposed on the first n-type sub-regions can have materials with SiP and a dopant concentration ranging from about $1\times10^{20}$ atoms/cm$^3$ to about $1\times10^{22}$ atoms/cm$^3$. Third n-type sub-regions disposed on the second n-type sub-regions can have materials with material compositions and thicknesses similar to the first n-type sub-regions.

Epitaxial fin regions 110A-110B along with their underlying nanostructured regions 120A and 122A can form source/drain (S/D) regions 126A-126B, respectively. In some embodiments, epitaxial fin regions 110A-10B as shown in FIGS. 2B-2A can form S/D regions 126A-126B, respectively. Nanostructured channel regions 120B and 122B can be interposed between a pair of S/D regions 126A-126B, respectively, as shown in FIGS. 1C-1D and 2A-2B.

Gate structures 112A-112B can be multi-layered structures and can be wrapped around nanostructured channel regions 120B and 122B, respectively, for which gate structures 112A-112B can be referred to as "gate-all-around (GAA) structures" or "horizontal gate-all-around (HGAA) structures," and FETs 102A-102B can be referred to as "GAA FETs 102A-102B" or "GAA NFET and PFET 102A-102B," respectively.

Gate structures 112A-112B can include interfacial oxide layers 127A-127B, gate dielectric layers 128A-128B, gate WFM layers 130A-130B, metal capping layers 132A-132B, and gate metal fill layers 135A-135B, respectively. Gate structure 112B can further include a metal growth inhibition layer 131. Even though FIG. 1B shows that all the layers of gate structures 112A-112B are wrapped around nanostructured channel regions 120B and 122B, respectively, nanostructured channel regions 120B and 122B can be wrapped around by at least interfacial oxide layers 127A-127B and gate dielectric layers 128A-128B to fill the spaces between adjacent nanostructured channel regions 120B and 122B, and thus electrically isolate nanostructured channel regions 120B and 122B from each other, respectively, to prevent shorting between gate structures 112A-112B and S/D regions 126A-126B during operation of FETs 102A-102B, respectively. In some embodiments, instead of all the layers of gate structures 112A-112B being wrapped around nanostructured channel regions 120B and 122B, respectively, nanostructured channel regions 120B and 122B can be wrapped around by at least interfacial oxide layers 127A-127B, gate dielectric layers 128A-128B, gate WFM layers 130A-130B to fill the spaces between adjacent nanostructured channel regions 120B and 122B to achieve ultra-low threshold voltage for FETs 102A-102B, respectively.

Each of interfacial oxide layers 127A-127B can be disposed on respective nanostructured channel regions 120B and 122B, and can include silicon oxide and a thickness ranging from about 0.5 nm to about 1.5 nm. Each of gate dielectric layers 128A-128B can have a thickness (e.g., about 1 nm to about 3 nm) that is about 2 to 3 times the thickness of interfacial oxide layers 127A-127B and can include (i) a layer of silicon oxide, silicon nitride, and/or silicon oxynitride, (ii) a high-k dielectric material, such as hafnium oxide ($HfO_2$), titanium oxide ($TiO_2$), hafnium zirconium oxide (HfZrO), tantalum oxide ($Ta_2O_3$), hafnium silicate ($HfSiO_4$), zirconium oxide ($ZrO_2$), zirconium silicate ($ZrSiO_2$), (iii) a high-k dielectric material having oxides of lithium (Li), beryllium (Be), magnesium (Mg), calcium (Ca), strontium (Sr), scandium (Sc), yttrium (Y), zirconium (Zr), aluminum (Al), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu), or (iv) a combination thereof.

Referring to FIGS. 1B-1D, in some embodiments, WFM layers 130A-130B can be disposed on and in physical contact with gate dielectric layers 128A-128B and can include nWFM and pWFM layers for NFET 102A and PFET 102B, respectively. The nWFM layers can include a metallic material with a work function value closer to a conduction band energy than a valence band energy of a material of nanostructured channel regions 120B. For example, the nWFM layers can include an Al-based or Al-doped metallic material with a work function value less than 4.5 eV (e.g., about 3.5 eV to about 4.4 eV), which can be closer to the conduction band energy (e.g., 4.1 eV of Si or 3.8 eV of SiGe) than the valence band energy (e.g., 5.2 eV of Si or 4.8 eV of SiGe) of Si-based or SiGe-based nanostructured channel regions 120B, respectively. In some embodiments, the nWFM layers can include titanium aluminum (TiAl), titanium aluminum carbide (TiAlC), tantalum aluminum (TaAl), tantalum aluminum carbide (TaAlC), Al-doped Ti, Al-doped TiN, Al-doped Ta, Al-doped TaN, or a combination thereof. In some embodiments, each of the nWFM layers can include a thickness ranging from about 1 nm to about 3 nm. The thickness within this range can allow the nWFM layers to be wrapped around nanostructured channel regions 120B for ultra-low threshold voltage of NFET 102A without being constrained by the spacing between adjacent nanostructured channel regions 120B.

The pWFM layers can include a metallic material with a work function value closer to a valence band energy than a conduction band energy of a material of nanostructured channel regions 122B. For example, the pWFM layers can include a substantially Al-free (e.g., with no Al) metallic material with a work function value equal to or greater than 4.5 eV (e.g., about 4.5 eV to about 5.5 eV), which can be closer to the valence band energy (e.g., 5.2 eV of Si or 4.8 eV of SiGe) than the conduction band energy (e.g., 4.1 eV of Si or 3.8 eV of SiGe) of Si-based or SiGe-based nanostructured channel regions 122B, respectively. In some embodiments, the pWFM layers can include substantially Al-free (e.g., with no Al) (i) Ti-based nitrides or alloys, such as TiN, TiSiN, titanium gold (Ti—Au) alloy, titanium copper (Ti—Cu) alloy, titanium chromium (Ti—Cr) alloy, titanium cobalt (Ti—Co) alloy, titanium molybdenum (Ti—Mo) alloy, or titanium nickel (Ti—Ni) alloy; (ii) Ta-based nitrides or alloys, such as TaN, TaSiN, Ta—Au alloy, Ta—Cu alloy, Ta—W alloy, tantalum platinum (Ta—Pt) alloy, Ta—Mo alloy, Ta—Ti alloy, or Ta—Ni alloy; or (iii) a combination thereof.

Metal growth inhibition layer 131 can be selectively disposed on WFM layer 130B without being disposed on gate dielectric layer 128A prior to the deposition of Al-based metallic material of WFM layer 130A on gate dielectric layer 128A. Metal growth inhibition layer 131 can be configured to inhibit deposition of any substantial thickness of the Al-based metallic material on WFM layer 130B (e.g., thickness of the Al-based metallic material on WFM layer 130B about 0 nm, about 0.1 nm, about 0.2 nm or about 0.5 nm) during the deposition of WFM layer 130A. As such, metal growth inhibition layer 131 can prevent and/or substantially reduce contamination of PFET gate structure 112B with Al atoms, which can decrease the work function values of the pWFM layers of WFM layers 130B and increase the PFET threshold voltage. Metal growth inhibition layer 131 can include a layer of material with a higher deposition selectivity on metal surfaces, such as WFM layer 130B than on dielectric surfaces, such as gate dielectric layer 128A. In some embodiments, metal growth inhibition layer 131 can include a Si-based layer, such as a layer of Si or its compound, a layer of amorphous or polycrystalline Si, or a combination thereof. In some embodiments, metal growth inhibition layer 131 can have a thickness ranging from about 0.5 nm to about 2 nm. Such a thickness range can allow metal growth inhibition layer 131 to wrap around nanostructured channel regions 122B for ultra-low threshold voltage of PFET 102B without being constrained by the spacing between adjacent nanostructured channel regions 122B.

Metal capping layers 132A-132B can be disposed on WFM layer 130A and metal growth inhibition layer 131, respectively. In some embodiments, metal capping layers 132A-132B can include metallic layers that act as an adhesion promoting layer, a glue layer, a primer layer, and/or a nucleation layer for overlying layers (e.g., gate metal fill layers 135A-135B) and/or act as a protective layer, an oxygen diffusion barrier layer, and/or a metal diffusion barrier layer for underlying layers (e.g., WFM layers 130A-130B). In some embodiments, metal capping layers 132A-132B can include materials that prevent the oxidation of WFM layers 130A (e.g., Al-based or Al-doped layers) during the processing of gate structures 112A-112B. WFM layers 130A are prevented from oxidation because oxidized WFM layers 130A (e.g., aluminum oxide-based layers) can have work function values closer to the valence band energy (e.g., 5.2 eV of Si or 4.8 eV of SiGe) than the conduction band energy (e.g., 4.1 eV of Si or 3.8 eV of SiGe) of Si-based or SiGe-based nanostructured channel regions 120B, respectively, and as a result, increase the threshold voltage of NFET 102A. In some embodiments, metal capping layers 132A-132B can include Al-free metallic layers, such as Ti, TiN, TiSiN, Ta, TaN, TaSiN, WN, WCN, other suitable metal nitrides, metal alloys, or a combination thereof. In some embodiments, metal capping layers 132A-132B can have a thickness ranging from about 1 nm to about 3 nm.

Each of gate metal fill layers 135A-135B can include a single metal layer or a stack of metal layers. The stack of metal layers can include metals different from each other. In some embodiments, each of gate metal fill layers 135A-135B can include a suitable conductive material, such as W, Ti, Ag, ruthenium (Ru), iridium (Ir), Mo, Cu, cobalt (Co), Ni, metal alloys, and/or combinations thereof. In some embodiments, gate metal fill layers 135A-135B can include fluorine-free and/or chlorine-free metal layers (e.g., Ru or Ir) formed from fluorine-free and/or chlorine-free precursors, such as organic precursors (e.g, $\eta^4$-2,3-dimethylbutadiene ruthenium tricarbonyl (Ru(DMBD)(CO)$_3$) or iridium acetylacetonate (Ir(acac)$_3$). In some embodiments, gate metal fill layers 135A-135B can have a thickness ranging from about 150 nm to about 200 nm.

Though gate structures 112A-112B are shown to have GAA structures, other gate structures (e.g., vertical GAA structures or gate structures without GAA structures) are within the scope and spirit of this disclosure.

Each of inner spacers 113A can be disposed between a sub-region 110As of epitaxial regions 110A and a sub-region 112As of gate structure 112A and each of inner spacers 113B can be disposed between a sub-region 110Bs of epitaxial regions 110B and a sub-region 112Bs of gate structure 112B. Each of inner spacers 113A-113B can prevent capacitive coupling between sub-regions 110As and 112As and between sub-regions 110Bs and 112Bs, respectively. Preventing capacitive coupling between these sub-regions can reduce parasitic capacitance between S/D regions 126A-126B and gate structures 112A-112B and improve device performance of FETs 102A-102B.

In some embodiments, inner spacers 113A-113B can include a low-k dielectric material with a dielectric constant less than about 3.9 and/or between about 1 to about 3.5. In some embodiments, the low-k dielectric material can include silicon oxycarbonitride (SiOCN), silicon carbon nitride (SiCN), silicon oxide carbide (SiOC), polymides, carbon-doped oxides, fluorine-doped oxides, hydrogen-doped oxides, or a combination thereof. In some embodiments, inner spacers 113A-113B can have material similar to or different from each other. In some embodiments, both FETs 102A-102B can have inner spacers, such as inner spacers 113A-113B or one of FETs 102A-102B can have inner spacers, such as inner spacers 113A or 113B. Though rectangular cross-sections of inner spacers 113A-113B are shown in FIGS. 1C-1D, inner spacers 113A-113B can have cross-sections of other geometric shapes (e.g., semicircular, triangular, or polygonal). In some embodiments, each of inner spacers 113A-113B can have a horizontal dimension along an X-axis ranging from about 3 nm to about 15 nm.

Outer spacers 114A-114B can be disposed on sidewalls of respective gate structures 112A-112B and be in physical contact with respective gate dielectric layers 128A-128B, according to some embodiments. Outer spacers 114A-114B can include an insulating material, such as silicon oxide, silicon nitride, silicon carbon nitride (SiCN), silicon oxy-carbon nitride (SiOCN), a low-k material, or a combination thereof. Outer spacers 114A-114B can have a low-k material with a dielectric constant less than about 3.9 and/or between about 1 to about 3.5. In some embodiments, each of outer spacers 114A-114B can have a thickness ranging from about 2 nm to about 10 nm. In some embodiments, a horizontal distance between outer spacers 114A along an X-axis is greater than a horizontal distance between inner spacers 113A along an X-axis. Similarly, a horizontal distance between outer spacers 114B along an X-axis is greater than a horizontal distance between inner spacers 113B along an X-axis.

FETs 102A-102B can be incorporated into an integrated circuit through the use of other structural components, such as gate contact structures, S/D contact structures, conductive vias, conductive lines, interconnect metal layers, etc., which are not shown herein for the sake of clarity.

Referring to FIGS. 1A-1D, semiconductor device 100 can further include etch stop layer (ESL) 116, interlayer dielectric (ILD) layer 118, and shallow trench isolation (STI) regions 138. ESL 116 can be disposed on sidewalls of outer spacers 114A-114B and on epitaxial regions 110A-110B. ESL 116 can be configured to protect gate structures 112A-112B and/or S/D regions 126A-126B. This protection can be provided, for example, during the formation of ILD layer 118 and/or S/D contact structures (not shown). In some embodiments, ESL 116 can include, for example, silicon nitride ($SiN_x$), silicon oxide ($SiO_x$), silicon oxynitride (SiON), silicon carbide (SiC), silicon carbo-nitride (SiCN), boron nitride (BN), silicon boron nitride (SiBN), silicon carbon boron nitride (SiCBN), or a combination thereof. In some embodiments, ESL 116 can have a thickness ranging from about 3 nm to about 30 nm.

ILD layer 118 can be disposed on ESL 116 and can include a dielectric material deposited using a deposition method suitable for flowable dielectric materials (e.g., flowable silicon oxide, flowable silicon nitride, flowable silicon oxynitride, flowable silicon carbide, or flowable silicon oxycarbide). In some embodiments, the dielectric material is silicon oxide. In some embodiments, ILD layer 118 can have a thickness in a range from about 50 nm to about 200 nm.

STI regions 138 can be configured to provide electrical isolation between FETs 102A-102B and neighboring FETs (not shown) on substrate 106 and/or neighboring active and passive elements (not shown) integrated with or deposited on substrate 106. In some embodiments, STI regions 138 can include a plurality of layers, such as a nitride layer, an oxide layer disposed on the nitride layer, and an insulating layer disposed on the nitride layer. In some embodiments, the insulating layer can include silicon oxide, silicon nitride, silicon oxynitride, fluorine-doped silicate glass (FSG), a low-k dielectric material, and/or other suitable insulating materials. In some embodiments, STI regions 138 can have a vertical dimension along a Z-axis ranging from about 40 nm to about 200 nm.

The cross-sectional shapes of semiconductor device 100 and its elements (e.g., fin structure 108A-108B, gate structures 112A-112B, epitaxial fin regions 110A-110B, inner spacers 113-113B, outer spacers 114A-114B, and/or STI regions 138) are illustrative and are not intended to be limiting.

Figure 3:
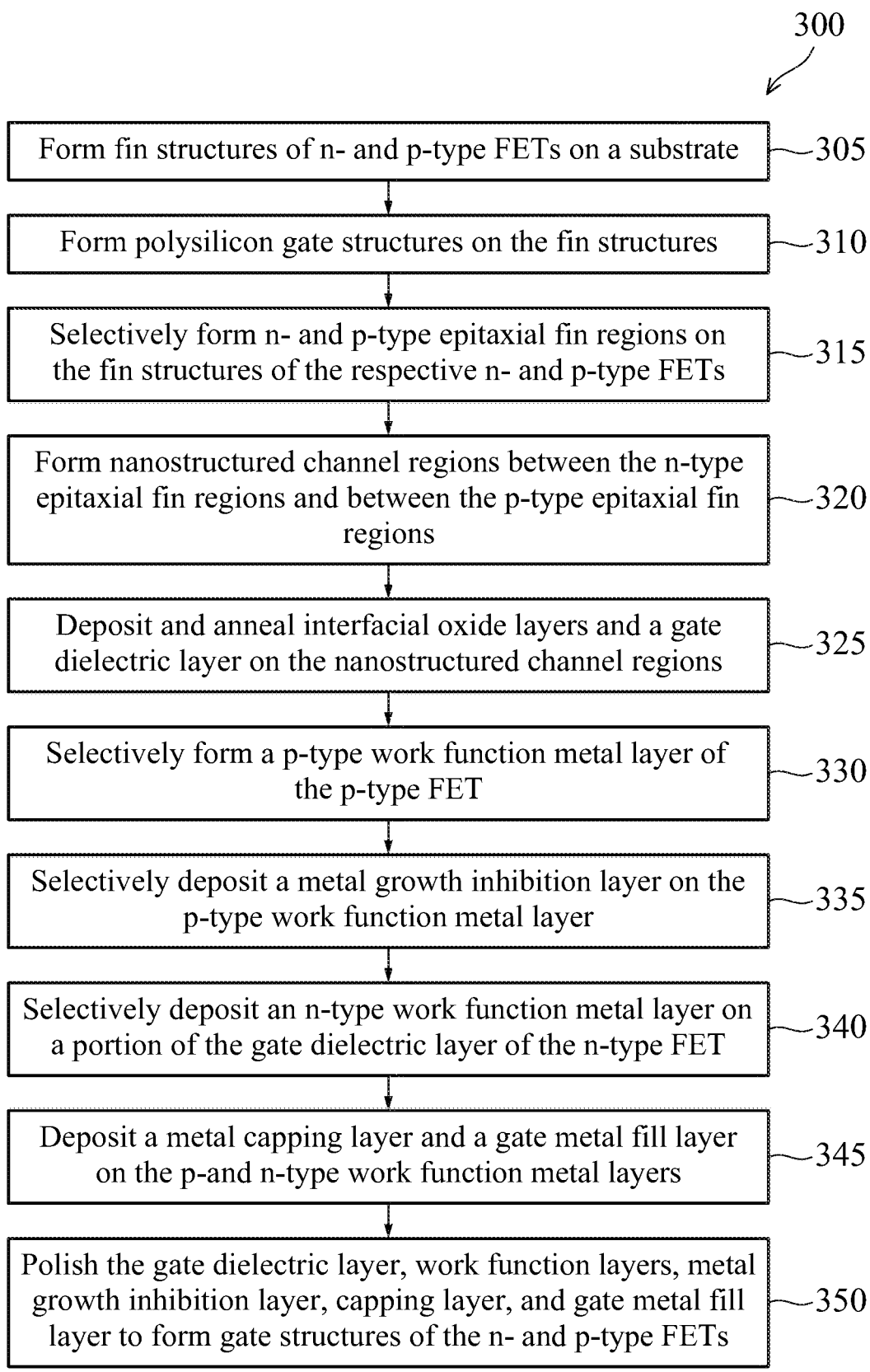
FIG. 3 is a flow diagram of a method for fabricating a semiconductor device with different gate structures, in accordance with some embodiments.

FIG. 3 is a flow diagram of an example method 300 for fabricating semiconductor device 100, according to some embodiments. For illustrative purposes, the operations illustrated in FIG. 300 will be described with reference to the example fabrication process for fabricating semiconductor device 300 as illustrated in FIGS. 4A-18A, 4B-18B, 7C-12C, and 7D-12D. FIGS. 4A-12A are isometric views of semiconductor device 100 at various stages of its fabrication. FIGS. 4B-12B are cross-sectional views along lines B-B of structures of FIGS. 4A-12A, respectively, according to some embodiments. FIGS. 7C-12C and 7D-12D are cross-sectional views along lines C-C and D-D of structures of FIGS. 7A-12A, respectively, according to some embodiments. FIGS. 13A-18A and 13B-18B are cross-sectional views along lines C-C and D-D, respectively, of semiconductor device 100 at various stages of fabrication of gate structures 112A-112B following the formation of the structure of FIG. 12A, according to some embodiments. Operations can be performed in a different order or not performed depending on specific applications. It should be noted that method 300 may not produce a complete semiconductor device 100. Accordingly, it is understood that additional processes can be provided before, during, and after method 300, and that some other processes may only be briefly described herein. Elements in FIGS. 4A-18A, 4B-18B, 7C-12C, and 7D-12D with the same annotations as elements in FIGS. 1A-1D are described above.

In operation 305, fin structures of an NFET and a PFET are formed on a substrate. For example, fin structures 108A*-108B* (shown in FIGS. 5A-5B) with fin base portions 119A-119B and stacks of first and second semiconductor layers 120 and 122 arranged in alternating configurations can be formed on substrate 106 as described with reference to FIGS. 4A-5B. In subsequent processing, fin structures 108A*-108B* can form fin structures 108A-108B (shown in FIGS. 1A-1D) after the removal of second and first semiconductor layers 122 and 120 from fin structures 108A*-108B*, respectively. The process for forming fin structures 108A*-108B* can include forming a stacked layer 108* on substrate 106 as shown in FIGS. 4A-4B. Stacked layer 108* can include first and second semiconductor layers 120* and 122* stacked in an alternating configuration. First and second semiconductor layers 120* and 122* can have respective vertical dimensions $H_1$ and $H_2$ along a Z-axis ranging from about 5 nm to about 30 nm.

Each of first and second semiconductor layers 120* and 122* can be epitaxially grown on its underlying layer and can include semiconductor materials different from each other. In some embodiments, first and second semiconductor layers 120* and 122* can include semiconductor materials with oxidation rates and/or etch selectivity different from each other. In some embodiments, first and second semiconductor layers 120* and 122* can include semiconductor materials similar to or different from substrate 106. First and second semiconductor layers 120* and 122* can include (i) an elementary semiconductor, such as silicon or germanium; (ii) a compound semiconductor including a III-V semiconductor material; (iii) an alloy semiconductor including SiGe, germanium stannum, or silicon germanium stannum; or (iv) a combination thereof. In some embodiments, first semiconductor layers 120* can include Si and second semiconductor layers 122* can include SiGe. In some embodiments, first and second semiconductor layers 120* and 122* can include SiGe with Ge in a range from about 25 atomic percent to about 50 atomic percent with any remaining atomic percent being Si or can include Si without any substantial amount of Ge (e.g., with no Ge).

First and/or second semiconductor layers 120* and 122* can be undoped or can be in-situ doped during their epitaxial growth process using (i) p-type dopants, such as boron, indium, or gallium; and/or (ii) n-type dopants, such as phosphorus or arsenic. For p-type in-situ doping, p-type doping precursors, such as diborane ($B_2H_6$), boron trifluoride ($BF_3$), and/or other p-type doping precursors can be used. For n-type in-situ doping, n-type doping precursors, such as phosphine ($PH_3$), arsine ($AsH_3$), and/or other n-type doping precursor can be used.

The process for forming fin structures 108A*-108B* can further include etching the structure of FIG. 4A through patterned hard mask layers (not shown) formed on stacked layer 108* of FIG. 4A. In some embodiments, hard mask layers can include layers of silicon oxide formed, for example, using a thermal oxidation process and/or layers of silicon nitride formed using, for example, low pressure chemical vapor deposition (LPCVD) or plasma enhanced CVD (PECVD). The etching of the structure of FIG. 4A can include a dry etch, a wet etch process, or a combination thereof.

The dry etch process can include using etchants having an oxygen-containing gas, a fluorine-containing gas (e.g., $CF_4$, $SF_6$, $CH_2F_2$, $CHF_3$, $NF_3$, and/or $C_2F_6$), a chlorine-containing gas (e.g., $Cl_2$, $CHCl_3$, $CCl_4$, HCl, and/or $BCl_3$), a bromine-containing gas (e.g., HBr and/or $CHBR_3$), ammonia gas ($NH_3$), an iodine-containing gas, other suitable etching gases and/or plasmas, or combinations thereof. The dry etch process can be carried out at high bias voltage ranging from about 150 V to about 350 V, at a radio frequency power ranging from about 10 W to about 50 W, at a pressure of about 5 Torr to about 50 Torr, at a temperature ranging from about 25° C. to about 40° C., and for a time period ranging from about 10 sec to about 40 sec.

The wet etch process can include etching in diluted hydrofluoric acid (DHF), potassium hydroxide (KOH) solution, ammonia ($NH_3$), a solution containing hydrofluoric acid (HF), nitric acid ($HNO_3$), acetic acid ($CH_3COOH$), or combinations thereof.

Figure 5B:
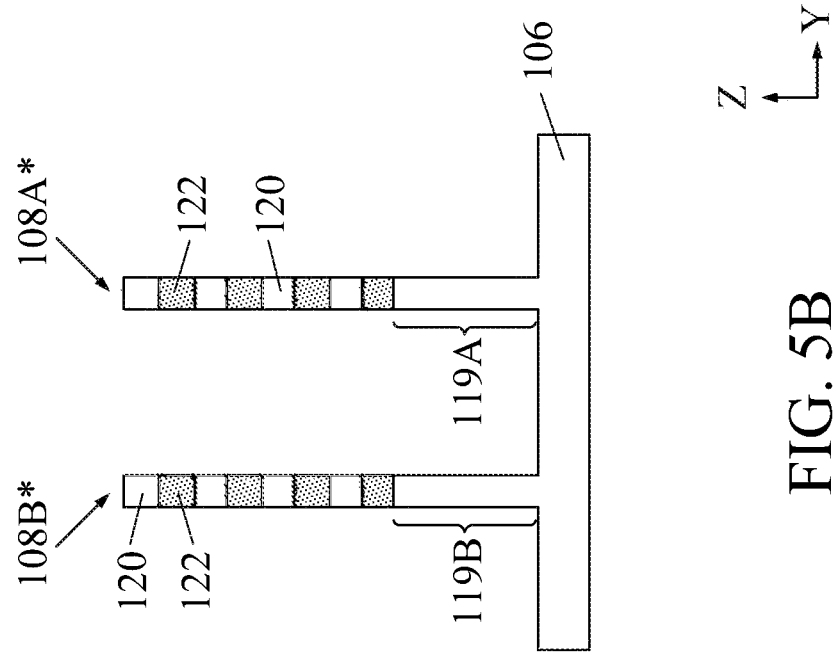
Figure 5A:
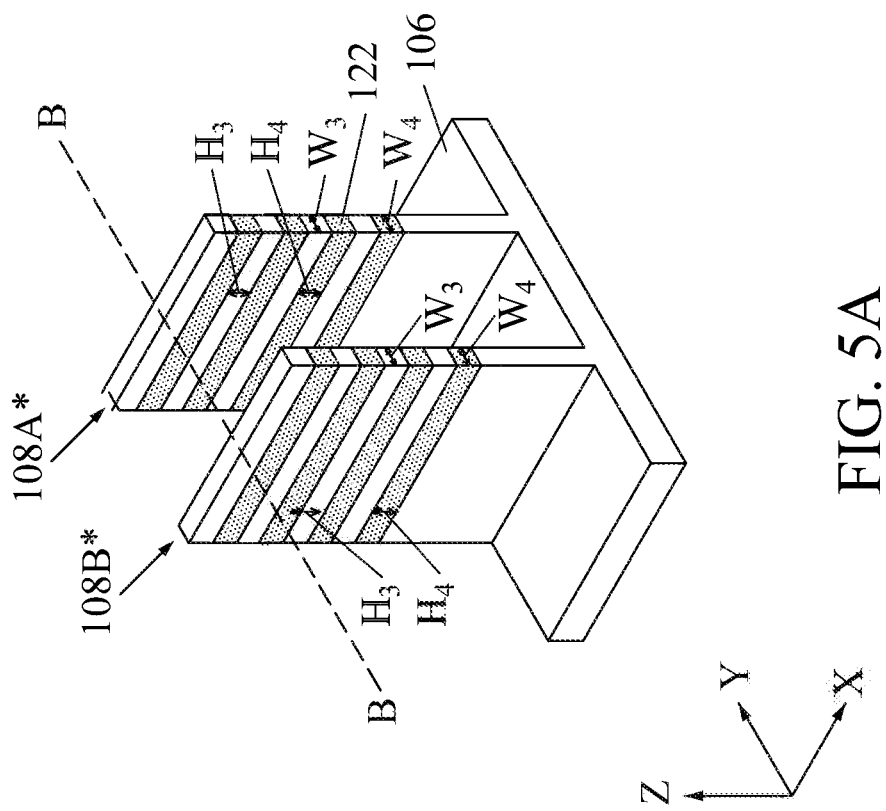

After the etching of stacked layer 108*, fin structures 108A*-108B* with fin base portions 119A-119B having respective vertical dimensions along a Z-axis ranging from about 40 nm to about 60 nm can be formed, as shown in FIGS. 5A-5B. Stacks of first and second semiconductor layers 120 and 122 formed on fin base portions 119A-119B can have respective vertical dimensions $H_3$ and $H_4$ along a Z-axis ranging from about 5 nm to about 30 nm and respective horizontal dimensions $W_3$ and $W_4$ along a Y-axis ranging from about 5 nm to about 50 nm. The ratios of $H_1/W_1$ and $H_2/W_2$ can each range from about 0.2 to about 5. In some embodiments, dimensions $H_3$-$H_4$ and $W_3$-$W_4$ can be equal to or different from each other, respectively. In some embodiments, the ratios of $H_1/W_1$ and $H_2/W_2$ can be equal to or different from each other, respectively.

Following the formation of fin structures 108A*-108B*, passivation layers 109A-109B can be formed on fin structures 108A*-108B*, respectively, and STI regions 138 can be formed on passivation layers 109A-109B, as shown in FIGS. 6A-6B. The process for forming passivation layers 109A-109B on fin structures 108A*-108B* can include blanket depositing a passivation layer 109 on the structure of FIG. 5A using one or more precursor gases having fluorine, chlorine, nitrogen, oxygen, hydrogen, deuterium, $NH_3$, and/or hydrogen sulfide ($H_2S$) in an ALD or CVD process. The portions of blanket deposited passivation layer 109 on fin structures 108A*-108B* can be referred to as "passivation layers 109A-109B," respectively.

The formation of STI regions 138 can include (i) depositing a layer of nitride material (not shown) on passivation layer 109 using ALD or CVD, (ii) depositing a layer of oxide material (not shown) on the layer of nitride material using ALD or CVD, (iii) depositing a layer of insulating material (not shown) on the layer of oxide material, (iv) annealing the layer of insulating material, (v) chemical mechanical polishing (CMP) the layers of nitride and oxide materials and the annealed layer of insulating material, and (vi) etching back the polished structure by a dry etch process, a wet etch process, or a combination thereof to form STI regions 138 of FIGS. 6A-6B.

Referring to FIG. 3, in operation 310, polysilicon structures are formed on the fin structures. For example, as shown in FIGS. 6A-6B, polysilicon structures 112A*-112B* can be formed on fin structures 108A*-108B* and outer spacers 114A-114B can be formed on sidewalls polysilicon structures 112A*-112B*. In some embodiments, prior to the formation of polysilicon structures 112A*-112B*, protective oxide layers 640A-640B can be formed on respective passivation layers 109A-109B and polysilicon structures 112A*-112B* can be formed on respective protective oxide layer 640A-640B and STI regions 138, as described with reference to FIGS. 6A-6B.

The process for forming protective oxide layers 640A-640B can include (i) blanket depositing a layer of oxide material (not shown) on the partial semiconductor device 100 (not shown) formed after the formation of STI regions 138, (ii) a high temperature annealing process, and (iii) an etching process. The layer of oxide material can include silicon oxide and can be blanket deposited using a suitable deposition process, such as CVD, ALD, plasma enhanced ALD (PEALD), physical vapor deposition (PVD), or e-beam evaporation. In some embodiments, the layer of oxide material can be blanket deposited using PEALD at an energy ranging from about 400 W to about 500 W and at a temperature ranging from about 300° C. to about 500° C. The blanket deposition of the layer of oxide material can be followed by a dry annealing process under oxygen gas flow at a temperature ranging from about 800° C. to about 1050° C. The oxygen precursor concentration can be in a range of about 0.5% to about 5% of the total gas flow rate. In some embodiments, the annealing process can be a flash process where the annealing time can be between about 0.5 s to about 5 s. The etching process to form protective oxide layers 640A-640B may not follow the annealing process and can be carried out during the formation of polysilicon structures 112A*-112B* described below or as a separate etching process after the formation of polysilicon structures 112A*-112B*.

The annealing of the blanket deposited layer of oxide material for protective oxide layers 640A-640B can be followed by the formation of polysilicon structures 112A*-112B*. During subsequent processing, polysilicon structures 112A*-112B* can be replaced in a gate replacement process to form gate structures 112A-112B, respectively. In some embodiments, the process for forming polysilicon structures 112A*-112B* can include blanket depositing a layer of polysilicon material on the annealed layer of oxide material for protective oxide layers 640A-640B and etching the blanket deposited layer of polysilicon material through patterned hard mask layers 642A-642B formed on the layer of polysilicon material. In some embodiments, the polysilicon material can be undoped and hard mask layers 642A-642B can include an oxide layer and/or a nitride layer. The oxide layer can be formed using a thermal oxidation process and the nitride layer can be formed by LPCVD or PECVD. Hard mask layers 642A-642B can protect polysilicon structures 112A*-112B* from subsequent processing steps (e.g., during formation of inner spacers 113A-113, outer spacers 114A-114B, epitaxial fin regions 110A-110B, ILD layer 118, and/or ESL 116).

The blanket deposition of the layer of polysilicon material can include CVD, PVD, ALD, or other suitable deposition processes. In some embodiments, the etching of the blanket deposited layer of polysilicon material can include a dry etching process, a wet etching process, or a combination thereof. In some embodiments, the etching of the blanket deposited layer of polysilicon material can include four etching steps. The first polysilicon etch step can include using a gas mixture having hydrogen bromide (HBr), oxygen ($O_2$), fluoroform ($CHF_3$), and chlorine ($Cl_2$). The second polysilicon etch step can include using a gas mixture having HBr, $O_2$, $Cl_2$, and nitrogen ($N_2$) at a pressure of about 45 mTorr to about 60 mTorr. The third polysilicon etch step can include using a gas mixture having HBr, $O_2$, $Cl_2$, $N_2$, and argon (Ar) at a pressure of about 45 mTorr to about 60 mTorr. The fourth polysilicon etch step can include using a gas mixture having HBr, $O_2$, $Cl_2$, and $N_2$ at a pressure of about 45 mTorr to about 60 mTorr. Along with the polysilicon material, the fourth polysilicon etch step can remove portions of the annealed blanket deposited layer of oxide material for protective oxide layers 640A-640B that are not covered by polysilicon structures 112A*-112B*, according to some embodiments. The first polysilicon etch step can have a higher polysilicon etch rate than the second, third, and/or fourth polysilicon etch steps. The first polysilicon etch step can be used to etch unwanted portions of the blanket deposited layer of polysilicon material above fin structures 108A*-108B*. The second, third, and fourth polysilicon etch steps can be used to etch unwanted portions of the blanket deposited layer of polysilicon material within high aspect ratio spaces 643.

In some embodiments, vertical dimensions of polysilicon structures 112A*-112B* along a Z-axis on top surfaces of fin structures 108A*-108B* can be in a range from about 40 nm to about 60 nm. Polysilicon structures 112A*-112B* can have an aspect ratio equal to or greater than about 9, where aspect ratio is a ratio of a vertical dimension along a Z-axis to a horizontal dimension along a Y-axis of polysilicon structures 112A*-112B*. In some embodiments, horizontal dimensions between center lines of adjacent polysilicon structures 112A*-112B* along a Y-axis (e.g., spacing) can be in a range from about 30 nm to about 70 nm.

Following the formation of polysilicon structures 112A*-112B*, the portions of the blanket deposited layer of oxide that are not covered by polysilicon structures 112A*-112B* can be removed by a dry or a wet etch process if they are not removed during the fourth polysilicon etch step to form the structure of FIGS. 6A-6B. The structure of FIGS. 6A-6B has polysilicon structures 112A*-112B* and protective oxide layers 640A-640B disposed on stacks of nanostructured regions 120B and 122B (FIG. 6B), respectively, and has stacks of nanostructured regions 120A and 122A (FIG. 6A) extending out from either sides of polysilicon structures 112A*-112B*, respectively, along an X-axis.

In some embodiments, protective oxide layers 640A-640B can have vertical dimensions (e.g., thickness on top surface of fin structures 108A*-108B*) along a Z-axis and horizontal dimensions (e.g., thickness on sidewalls of fin structures 108A*-108B*) along a Y-axis ranging from about 1 nm to about 3 nm. In some embodiments, the vertical dimensions can be equal to or greater than the horizontal dimensions. The presence of protective oxide layers 640A-640B allow etching polysilicon material from high aspect ratio spaces 643 (e.g., aspect ratio greater than 1:15, 1:18, or 1:20) without substantially etching and/or damaging fin structures 108A*-108B* during the formation of polysilicon structures 112A*-112B*.

Following the formation of polysilicon structures 112A*-112B*, outer spacers 114A-114B can be formed on sidewalls of polysilicon structures 112A*-112B* and on portions of passivation layers 109A-109B not covered by polysilicon structures 112A*-112B*, as shown in FIGS. 6A-6B.

Referring to FIG. 3, in operation 315, n- and p-type epitaxial fin regions are selectively formed on the fin structures. For example, n- and p-type epitaxial fin regions 110A-110B can be selectively formed on portions of fin structures 108A*-108B* (e.g., nanostructured regions 120A and 122A, respectively) that are not underlying polysilicon structures 112A*-112B*, respectively, as described with reference to FIGS. 7A-8D. In some embodiments, prior to the selective formation of epitaxial fin regions 110A-110B, inner spacers 113A-113B can be selectively formed on portions of nanostructured regions 120A and 122B that are not wrapped around by epitaxial fin regions 110A-110B, respectively, in subsequent processing. In some embodiments, the selective formation of inner spacers 113A can be followed by the selective formation of epitaxial fin regions 110A, which can be followed by the selective formation of inner spacers 113B and subsequently, the selective formation of epitaxial fin regions 110B, as described with reference to FIGS. 7A-8D.

Prior to the formation of inner spacers 113A and epitaxial regions 110A of FET 102A, FET 102B can be protected by patterning a photoresist layer 746 on FET 102B as shown in FIGS. 7B-7C. Photoresist layer 746 is not shown in FIG. 7A for the sake of clarity. The process for forming inner spacers 113A can include sequential steps of (i) etching portions of outer spacers 114A from the stack of nanostructured regions 120A and 122A extending out from either sides of polysilicon structure 112A* along an X-axis, (ii) etching nanostructured regions 122A from the stack of nanostructured regions 120A and 122A to form suspended nanostructured regions 120A with openings (not shown) between them, (iii) blanket depositing a layer of low-k dielectric material (not shown) until the openings are filled or partially filled with the layer of low-k dielectric material, and (iv) etching the blanket deposited layer of low-k dielectric material to etch back the layer of low-k dielectric material within the openings to form inner spacers 113A as shown in FIG. 7D.

The etching of outer spacers 114A can include a dry etch process with etchant gases, such as $CH_4$, O2, and $CH_3F$. The flow rate ratio of $CH_4$:$O_2$:$CH_3F$ can range from about 1:1:1 to about 1:2:4. The etching of nanostructured regions 122A can include using a dry etching process or a wet etching process with higher selectivity towards SiGe than Si. For example, the wet etching process can include using a mixture of sulfuric acid ($H_2SO_4$) and hydrogen peroxide ($H_2O_2$) (SPM) and/or a mixture of ammonia hydroxide ($NH_4OH$) with $H_2O_2$ and deionized (DI) water (APM). As a result of the etching of nanostructured regions 122A, suspended nanostructured regions 120A can be formed with openings between them. The etching process can be controlled such that the openings extend along an X-axis at least under outer spacers 114A and the sidewalls of nanostructured regions 122B are substantially aligned with interfaces between outer spacers 114A and polysilicon structure 112A*. In some embodiments, the openings can further extend along an X-axis under polysilicon structure 112A* to prevent the formation of gate structure 112A under outer spacers 114A during the replacement of nanostructured regions 122B and polysilicon structure 112A* with gate structure 112A in subsequent processing.

The blanket deposition of the layer of low-k dielectric material can include using an ALD process or a CVD process. In some embodiments, the blanket deposition process can include a plurality of cycles of deposition and etch processes. In some embodiments, the low-k dielectric material can include silicon oxycarbonitride (SiOCN), silicon carbon nitride (SiCN), silicon oxide carbide (SiOC), polyimides, carbon-doped oxides, fluorine-doped oxides, hydrogen-doped oxides, or a combination thereof. The etching of the blanket deposited layer of low-k dielectric material can include a dry etch process using a gas mixture of HF and $NF_3$. The gas ratio of HF to $NF_3$ can range from about 1 to about 20.

Epitaxial fin regions 110A can be grown around the suspended nanostructured regions 120A after the formation of inner spacers 113A. In some embodiments, epitaxial fin regions 110A can be grown by (i) CVD, such as low pressure CVD (LPCVD), atomic layer CVD (ALCVD), ultrahigh vacuum CVD (UHVCVD), reduced pressure CVD (RPCVD), or any suitable CVD; (ii) molecular beam epitaxy (MBE) processes; (iii) any suitable epitaxial process; or (iv) a combination thereof. In some embodiments, epitaxial fin regions 110A can be grown by an epitaxial deposition/partial etch process, which repeats the epitaxial deposition/partial etch process at least once. N-type epitaxial fin regions 110A can include Si without any substantial amount of Ge (e.g., with no Ge) and can be in-situ doped during the epitaxial growth process using n-type dopants, such as phosphorus or arsenic. For n-type in-situ doping, n-type doping precursors such as, but not limited to, phosphine (PH3), arsine (AsH3), and/or other n-type doping precursor, can be used.

After the formation of inner spacers 113A and epitaxial regions 110A of FET 102A, photoresist layer 746 can be removed from FET 102B and another photoresist layer 846 can be patterned on FET 102A (shown in FIGS. 8B and 8D) to protect FET 102A during the subsequent processing steps to form inner spacers 113B and epitaxial regions 110B of FET 102B as described with reference to FIGS. 8A-8D. Photoresist layer 846 is not shown in FIG. 8A for the sake of clarity.

Figures 8A, 8B:
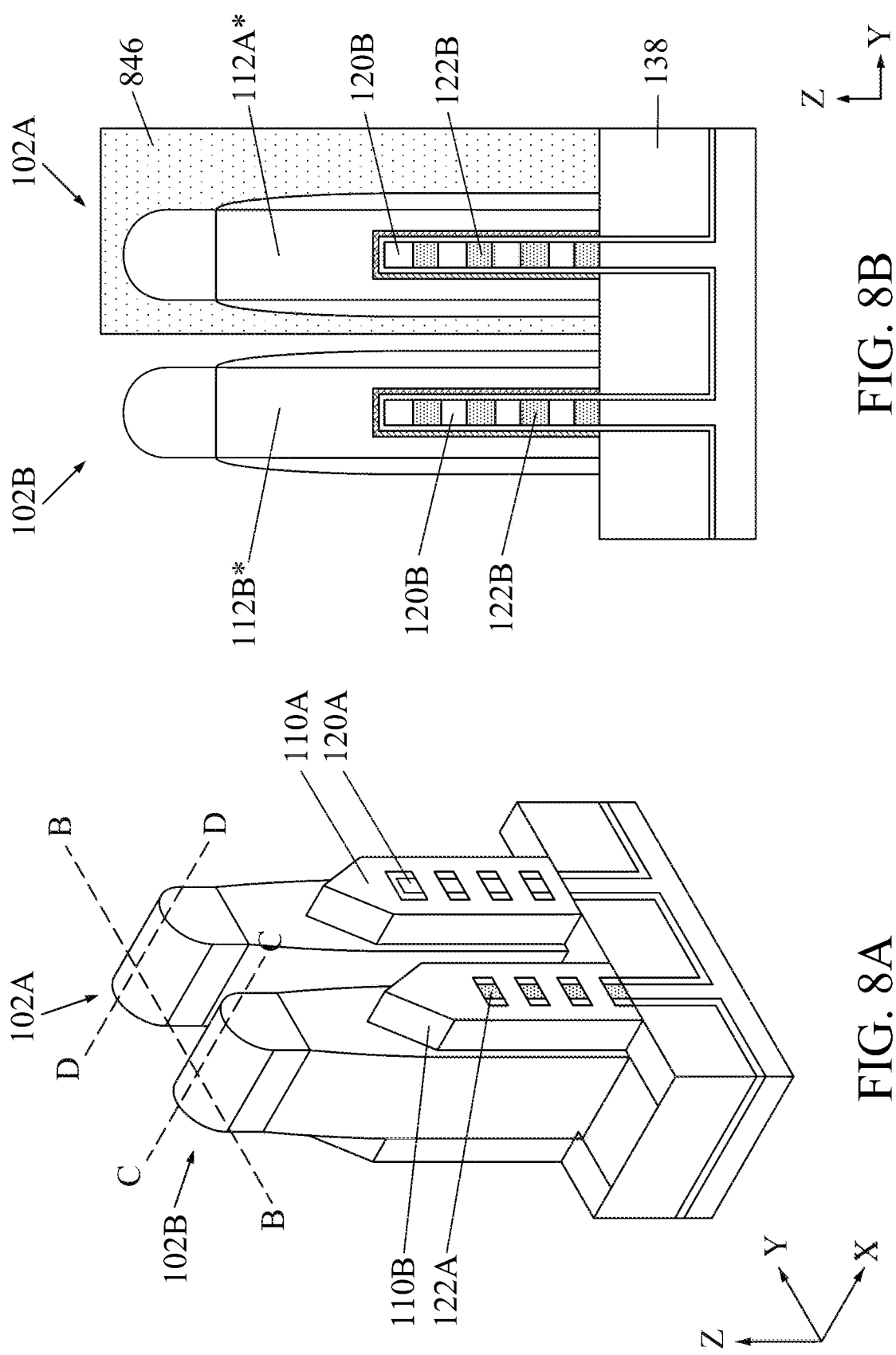
Figure 8D:
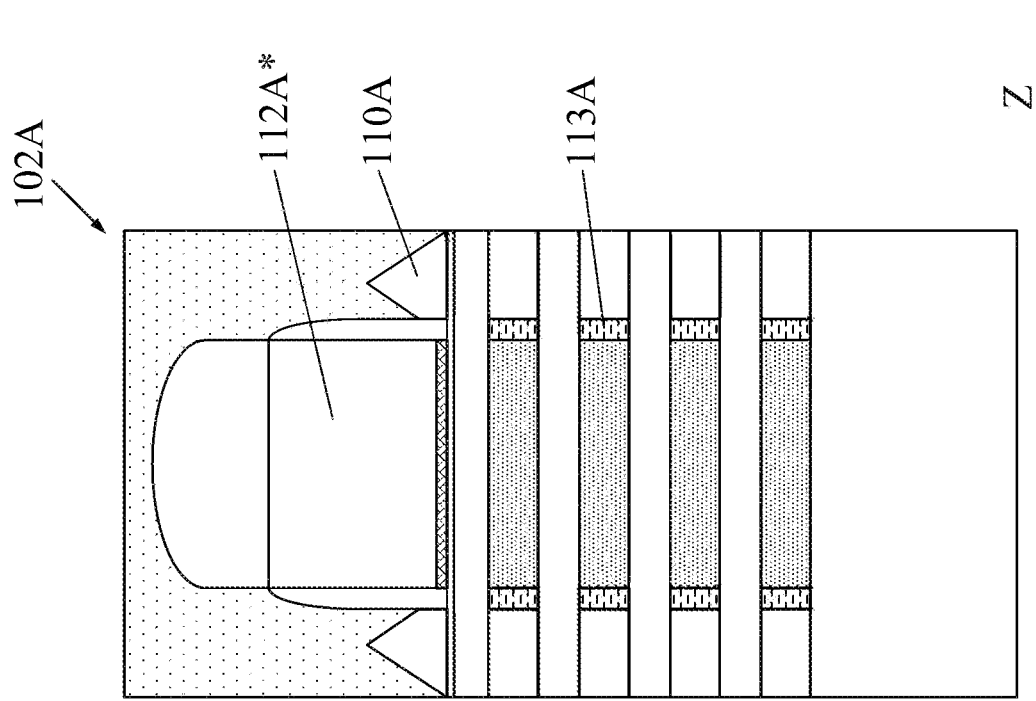
Figure 8C:
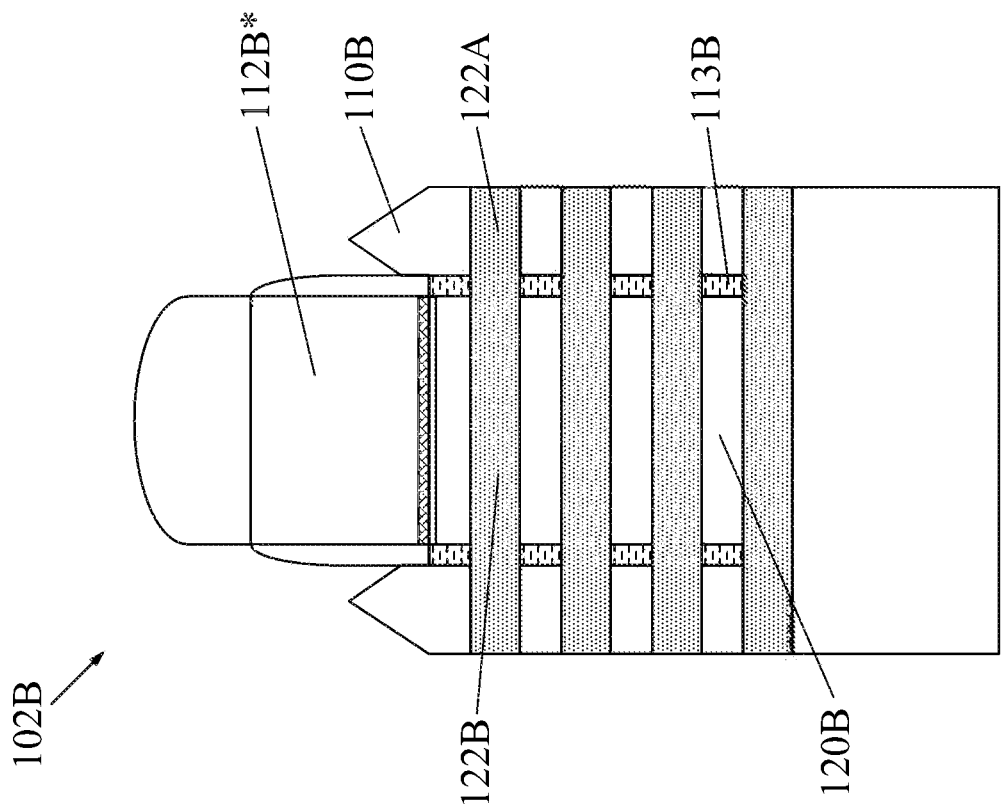

The process for forming inner spacers 113B can include sequential steps of (i) etching portions of outer spacers 114B from the stack of nanostructured regions 120A and 122A extending out from either sides of polysilicon structure 112B* along an X-axis, (ii) etching nanostructured regions 120A from the stack of nanostructured regions 120A and 122A to form suspended nanostructured regions 122A with openings (not shown) between them, (iii) blanket depositing a layer of low-k dielectric material (not shown) until the openings are filled or partially filled with the layer of low-k dielectric material, and (iv) etching the blanket deposited layer of low-k dielectric material to etch back the layer of low-k dielectric material within the openings to form inner spacers 113B as shown in FIG. 8C.

The process for etching the portions of outer spacers 114B can be similar to the etching process of outer spacers 114A. The etching of nanostructured regions 120A can include using a wet etching process with higher selectivity towards Si than SiGe. For example, the wet etching process can include using a mixture ($NH_4OH$) with HCl. The process for etching nanostructured regions 120A can be controlled such that the openings extend along an X-axis at least under outer spacers 114B and the sidewalls of nanostructured regions 120B are substantially aligned with interface between outer spacers 114B and polysilicon structure 112B*. In some embodiments, the openings can further extend along an X-axis under polysilicon structure 112B* to prevent the formation of gate structure 112B under outer spacers 114B during the replacement of nanostructured regions 120B and polysilicon structure 112B* with gate structure 112B in subsequent processing. The blanket deposition and the etching of the layer of low-k dielectric material can be similar to that used to deposit and etch back the layer of low-k dielectric material for forming inner spacers 113A.

Epitaxial fin regions 110B can be grown around the suspended nanostructured regions 122A after the formation of inner spacers 113B. Epitaxial fin regions 110B can be grown similarly as epitaxial fin regions 110A described with reference to FIG. 7A-7D, except p-type epitaxial fin regions 110B with SiGe can be in-situ doped during the epitaxial growth process using p-type dopants, such as boron, indium, or gallium. For p-type in-situ doping, p-type doping precursors such as, but not limited to, diborane (B2H6), boron trifluoride (BF3), and/or other p-type doping precursors can be used. After the formation of inner spacers 113B and epitaxial regions 110B, photoresist layer 846 can be removed from FET 102A.

In some embodiments, the processing steps for forming inner spacers 113A-113B can be simultaneously performed without using photoresist layers 746 and 846 if both FETs 102A-102B are of the same conductivity type (e.g., n-type or p-type). Similarly, the processing steps for forming epitaxial fin regions 110A-11B can be simultaneously performed without using photoresist layers 746 and 846 after simultaneously forming inner spacers 113A-113B if both FETs 102A-102B are of similar conductivity type.

Referring to FIG. 3, in operation 320, nanostructured channel regions are formed between the n-type epitaxial fin regions and between the p-type epitaxial fin regions. For example, nanostructured channel regions 120B and 122B can be formed sequentially in regions of fin structures 108A*-108B* underlying polysilicon structures 112A*-112B*, as described with reference to FIGS. 9A-12D. Prior to the formation of nanostructured channel regions 120B and 122B, ESL 116 can be deposited on the structure of FIG. 8A and ILD 118 can be deposited on ESL 116.

In some embodiments, ESL 116 can be formed of materials including $SiN_x$, $SiO_x$, SiON, SiC, SiCN, BN, SiBN, SiCBN, or a combination thereof. The formation of ESL 116 can include blanket depositing a layer of material for ESL 116 on the structure of FIG. 8A using PECVD, sub atmospheric chemical vapor deposition (SACVD), LPCVD, ALD, high-density plasma (HDP), plasma enhanced atomic layer deposition (PEALD), molecular layer deposition (MLD), plasma impulse chemical vapor deposition (PICVD), or other suitable deposition methods.

Figure 9D:
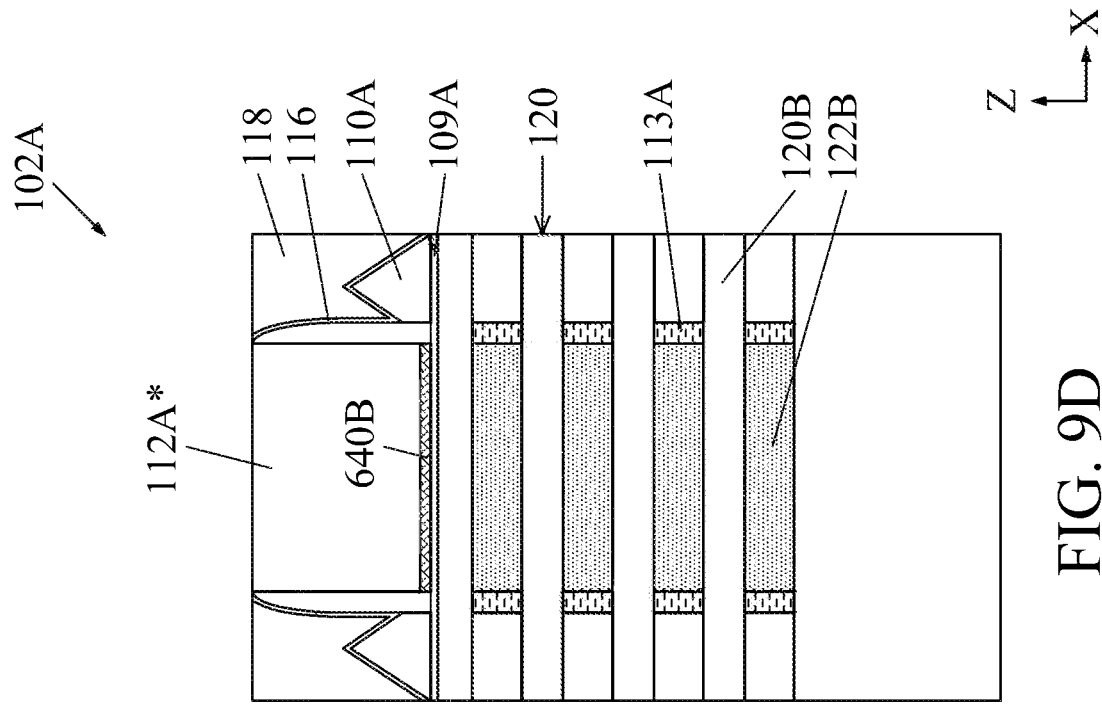

The blanket deposition of the layer of material for ESL 116 can be followed by a blanket deposition of a layer of dielectric material for ILD 118. In some embodiments, the dielectric material can be silicon oxide. The layer of dielectric material can be deposited using a deposition method suitable for flowable dielectric materials (e.g., flowable silicon oxide, flowable silicon nitride, flowable silicon oxynitride, flowable silicon carbide, or flowable silicon oxycarbide). For example, flowable silicon oxide can be deposited using a FCVD process. The blanket deposition process can be followed by a thermal annealing of the deposited layer of dielectric material in steam at a temperature ranging from about 200° C. to about 700° C. for a period ranging from about 30 minutes to about 120 minutes. The thermal annealing can be followed by a CMP process to coplanarize top surfaces of ESL 116, ILD 118, outer spacers 114A-114B, and polysilicon structures 112A*-112B* with each other as shown in FIG. 9A. During the CMP process, hard mask layers 642A-642B can be removed.

Figure 9C:
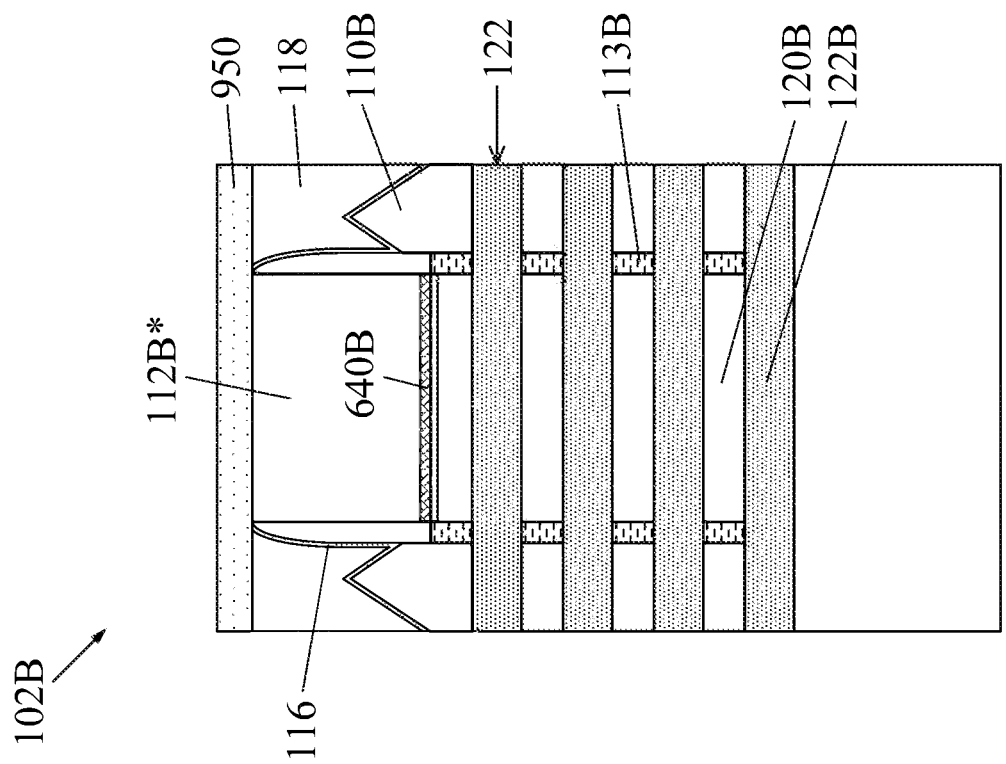
Figure 10B:
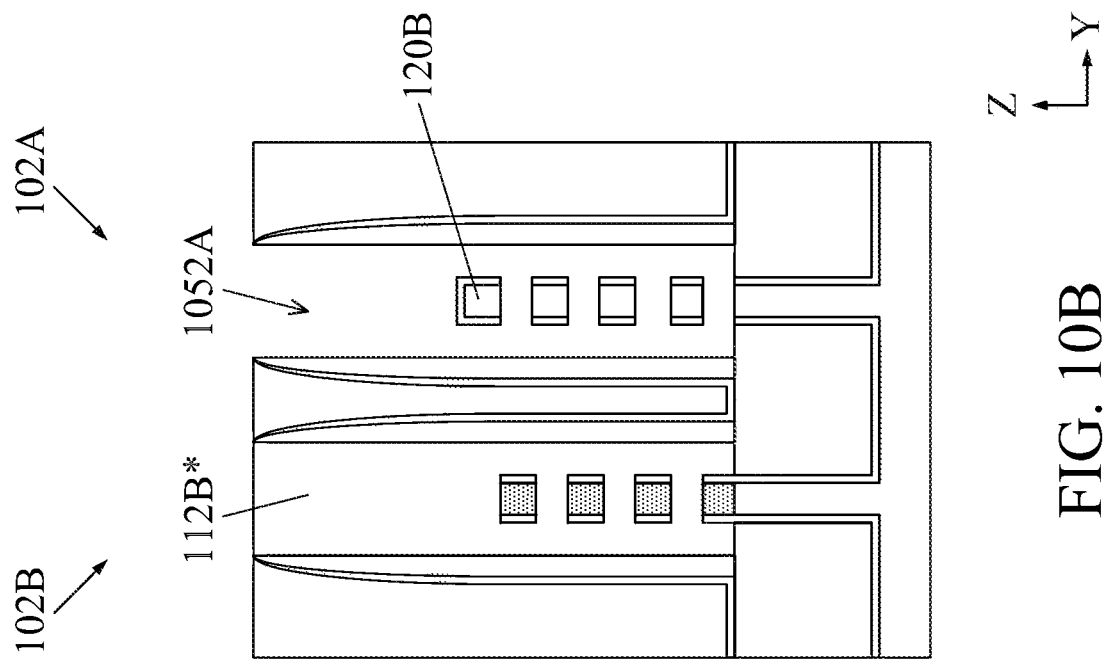
Figure 10A:
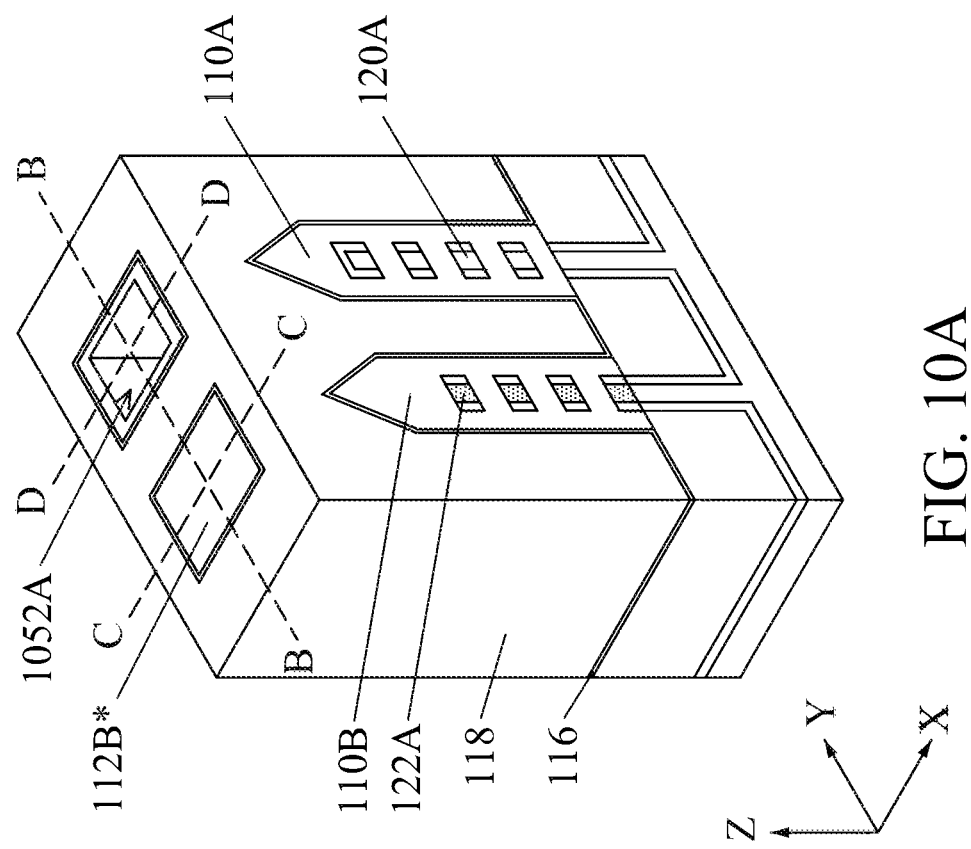
Figures 10C, 10D:
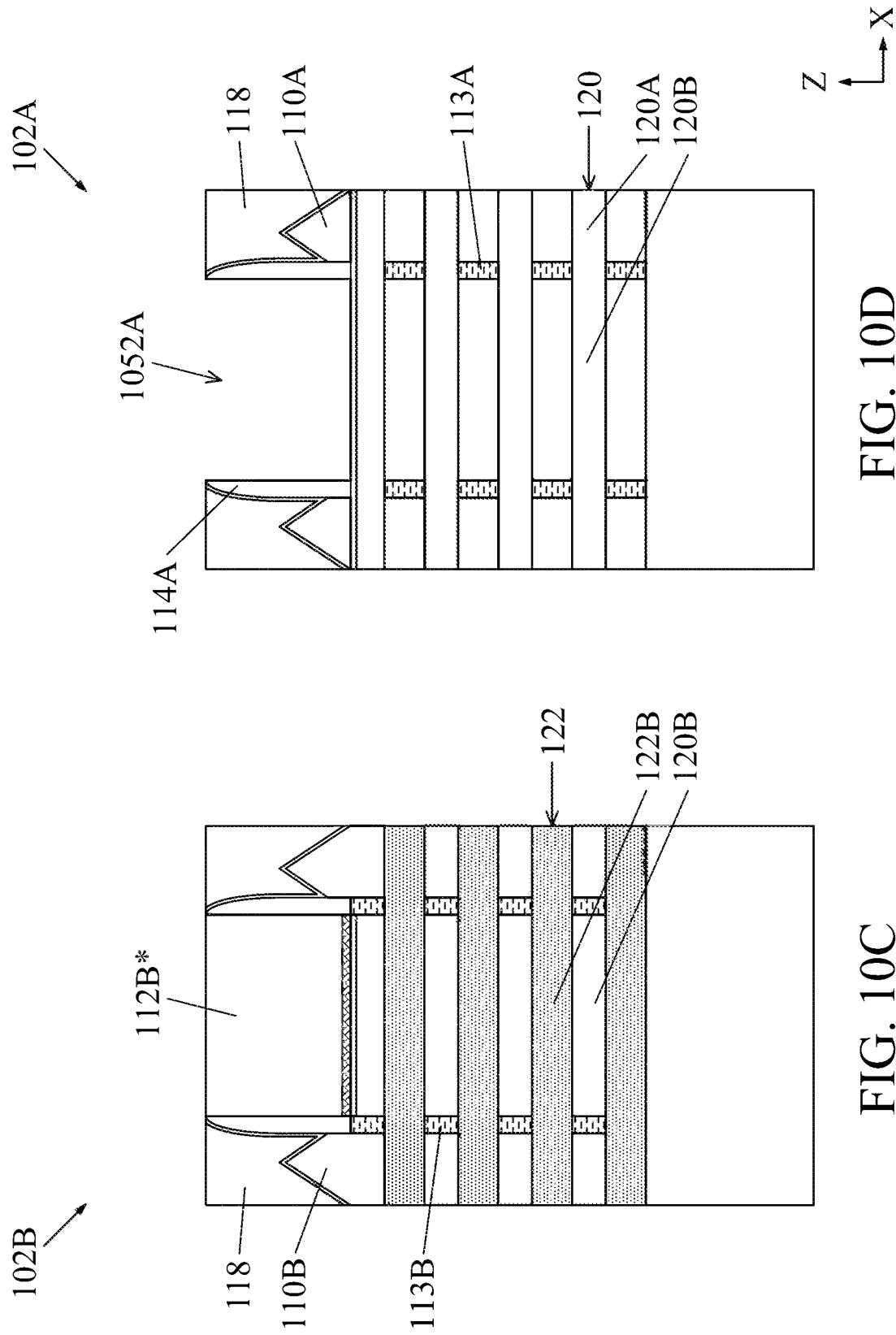

Following the CMP process, nanostructured channel regions 120B of FET 102A can be formed as described with reference to FIGS. 9A-10D. The process for forming nanostructured channel regions 120B can include sequential steps of (i) forming a photoresist layer 950 on FET 102B as shown in FIGS. 9A-9C, (ii) etching polysilicon structure 112A* and protective oxide layer 640A from the structure of FIG. 9A, and (iii) etching nanostructured regions 122B of FET 102A from the structure of FIG. 9A. In some embodiments, polysilicon structure 112A* and protective oxide layer 640A can be etched using the first, second, third, and/or fourth polysilicon etch steps described in operation 310. In some embodiments, nanostructured regions 122B can be etched using a wet etch process similar to that used for etching nanostructured regions 122A described with reference to FIGS. 7A-7D. As a result of the etching of nanostructured regions 122B, nanostructured channel regions 120B are formed with gate openings 1052A around them as shown in FIGS. 10B and 10D.

Figure 11B:
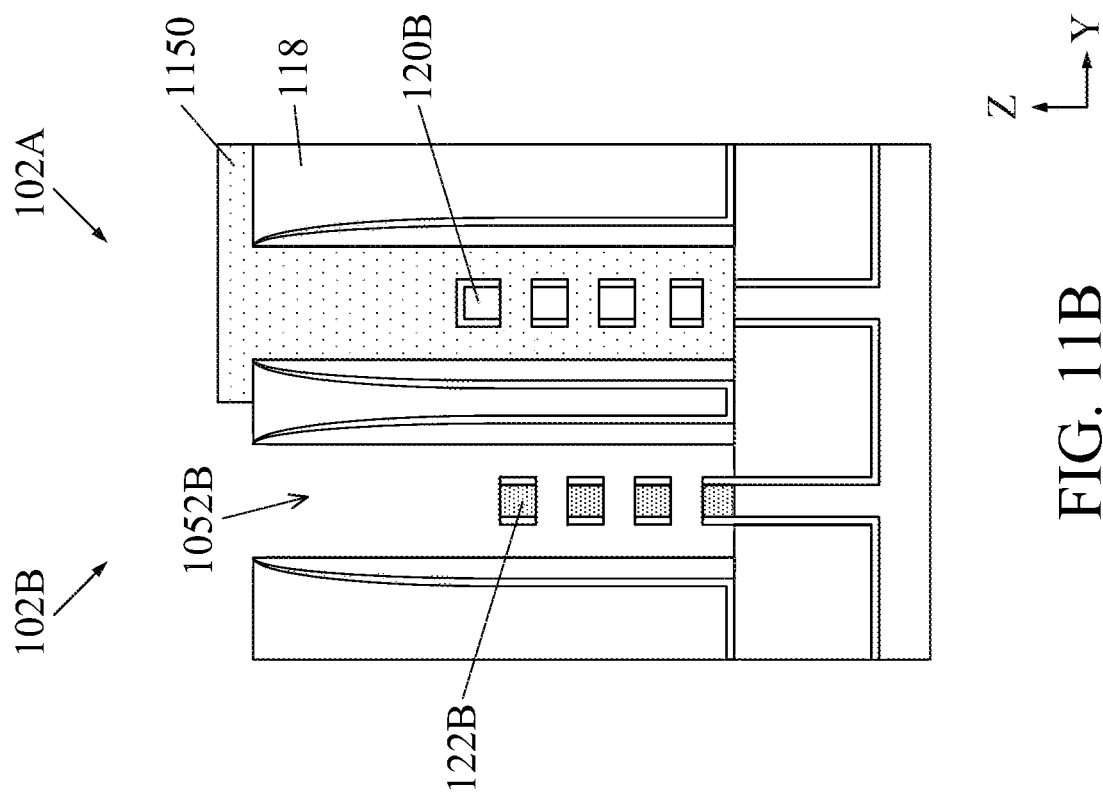
Figure 11A:
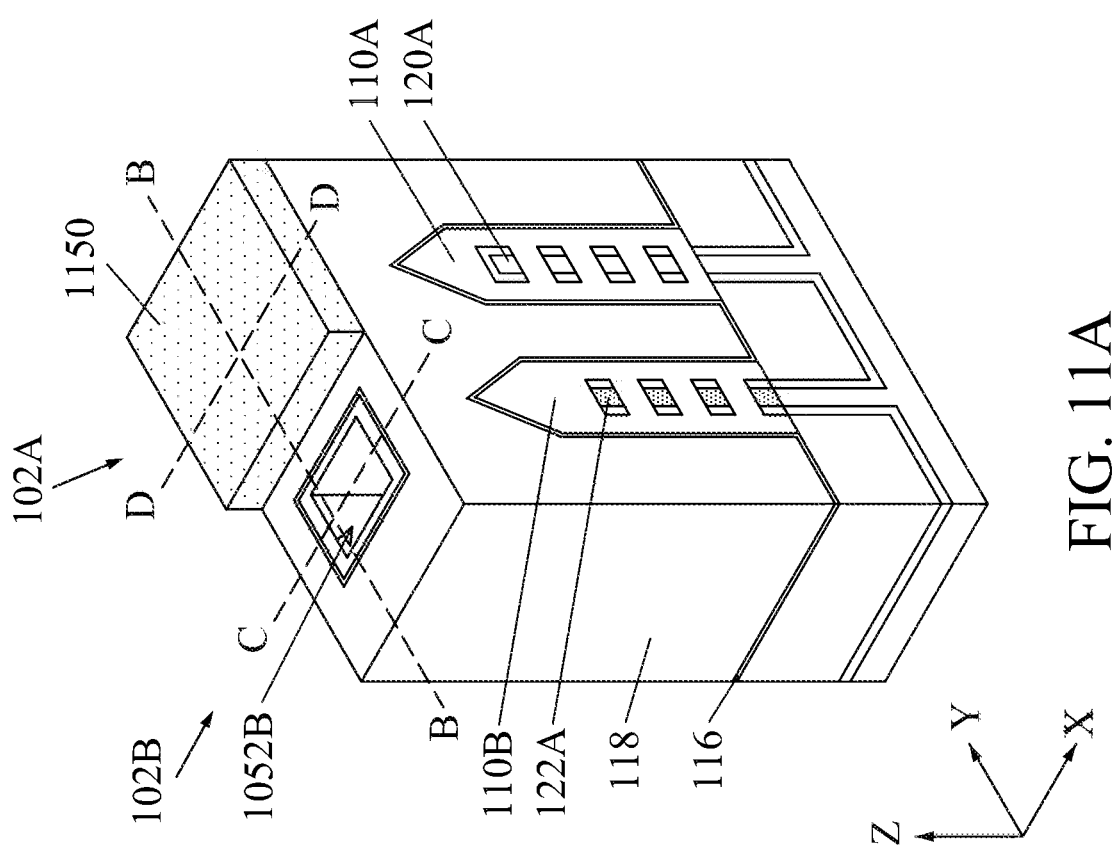
Figure 12D:
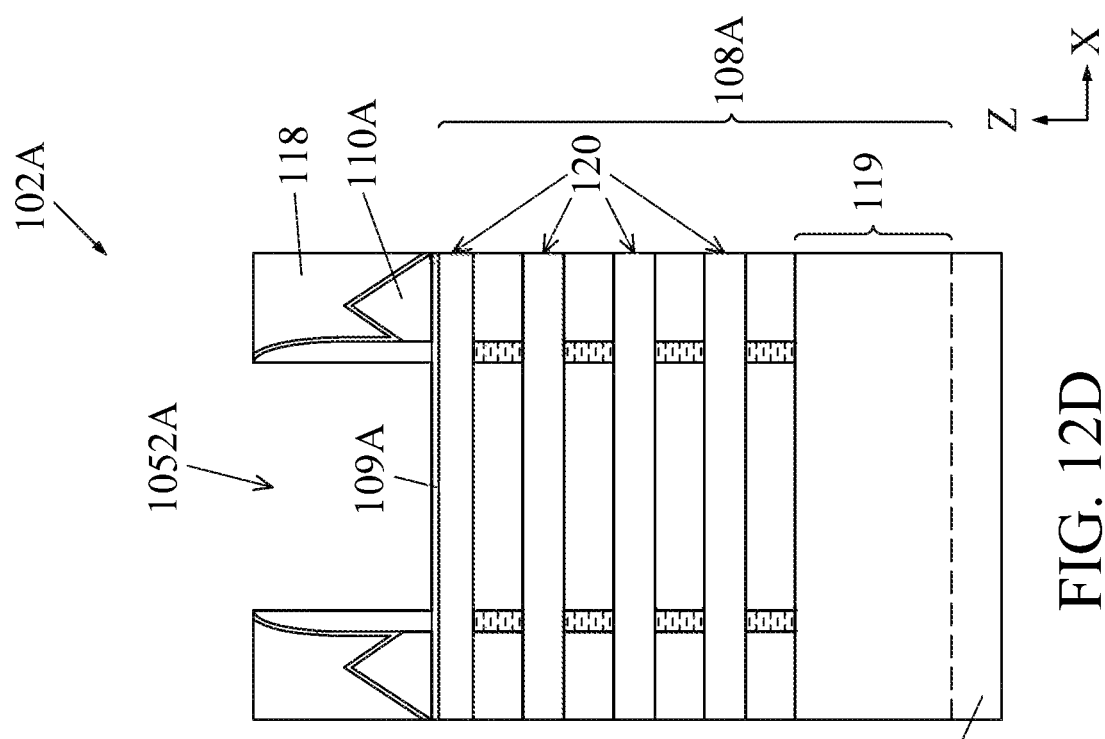
Figure 12C:
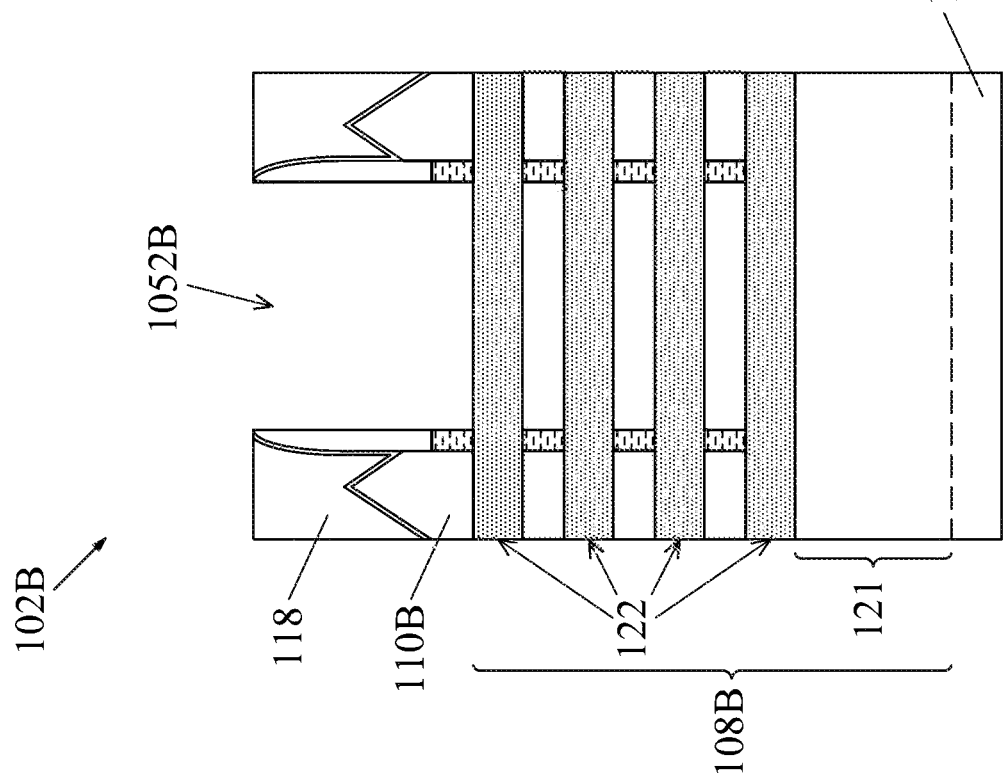

Following the etching of nanostructured regions 122B of FET 102A, nanostructured channel regions 122B of FET 102B can be formed as described with reference to FIGS. 11A-12D. The process for forming nanostructured channel regions 122B can include sequential steps of (i) removing photoresist layer 950, (ii) forming a photoresist layer 1150 within gate openings 1052A (shown in FIGS. 10B and 10D) to protect nanostructured channel regions 120A as shown in FIGS. 11B and 11D, (iii) etching polysilicon structure 112B* and protective oxide layer 640B, and (iv) etching nanostructured regions 120B of FET 102B from the structure of FIG. 10A. Similar to the etching of polysilicon structure 112A* and protective oxide layer 640A, polysilicon structure 112B* and protective oxide layer 640B can be etched using the first, second, third, and/or fourth polysilicon etch steps described in operation 310. In some embodiments, nanostructured regions 120B can be etched using a wet etch process similar to that used for etching nanostructured regions 120A described with reference to FIGS. 8A-8D. As a result of the etching of nanostructured regions 120B, nanostructured channel regions 122B are formed with gate openings 1052B around them as shown in FIGS. 11B and 11D. Following the formation of nanostructured channel regions 122B of FET 102B, photoresist layer 1150 can be removed from gate openings 1052A to form the structure of FIGS. 12A-12D.

The vertical dimensions (e.g., spacing) of gate openings 1052A-1052B along a Z-axis can be adjusted based on the thickness of nanostructured regions 122B and 120B removed from FETs 102A-102B and/or by additional etching of nanostructured channel regions 120B and 122B after the formation of gate openings 1052A-1052B, respectively. The vertical dimensions can be a value (e.g., from about 8 nm to about 12 nm) such that nanostructured channel regions 120B and 122B can be wrapped around by at least interfacial oxide layers 127A-127B and gate dielectric layers 128A-128B to fill gate openings 1052A-1052B to prevent shorting between gate structures 112A-112B and S/D regions 126A-126B during operation of FETs 102A-102B, respectively. In some embodiments, the vertical dimensions can be a value (e.g., from about 8 nm to about 12 nm) such that nanostructured channel regions 120B and 122B can be wrapped around by at least interfacial oxide layers 127A-127B, gate dielectric layers 128A-128B, gate WFM layers 130A-130B to fill gate openings 1052A-1052B to achieve ultra-low threshold voltage for FETs 102A-102B, respectively.

Referring to FIG. 3, in operations 325-350, gate-all-around (GAA) structures are formed on the nanostructured channel regions. For example, using the steps described in operations 325-350, gate structures 112A-112B can be formed wrapped around nanostructured channel regions 120B and 122B, respectively, as described with reference to FIGS. 13A-18D and 1A-1D.

In operation 325, interfacial oxide layers and a gate dielectric layer are deposited and annealed on the nanostructured channel regions. For example, interfacial oxide layers 127A-127B and a gate dielectric layer 128 can be deposited and annealed on nanostructured channel regions 120B and 122B, respectively, as described with reference to FIGS. 13A-14B. During subsequent processing, gate dielectric layer 128 can form gate dielectric layers 128A-128B as shown in FIGS. 1A-1D.

Interfacial oxide layers 127A-127B can be formed on exposed surfaces of nanostructured channel regions 120B and 122B within gate openings 1052A-1052B, respectively. In some embodiments, interfacial oxide layers 127A-127B can be formed by exposing nanostructured channel regions 120B and 122B to an oxidizing ambient. For example, the oxidizing ambient can include a combination of ozone ($O_3$), a mixture of ammonia hydroxide, hydrogen peroxide, and water (SC1 solution), and/or a mixture of hydrochloric acid, hydrogen peroxide, water (SC2 solution). As a result of the oxidation process, oxide layers ranging from about 0.5 nm to about 1.5 nm can be formed on the exposed surfaces of nanostructured channel regions 120B and 122B.

Figure 13B:
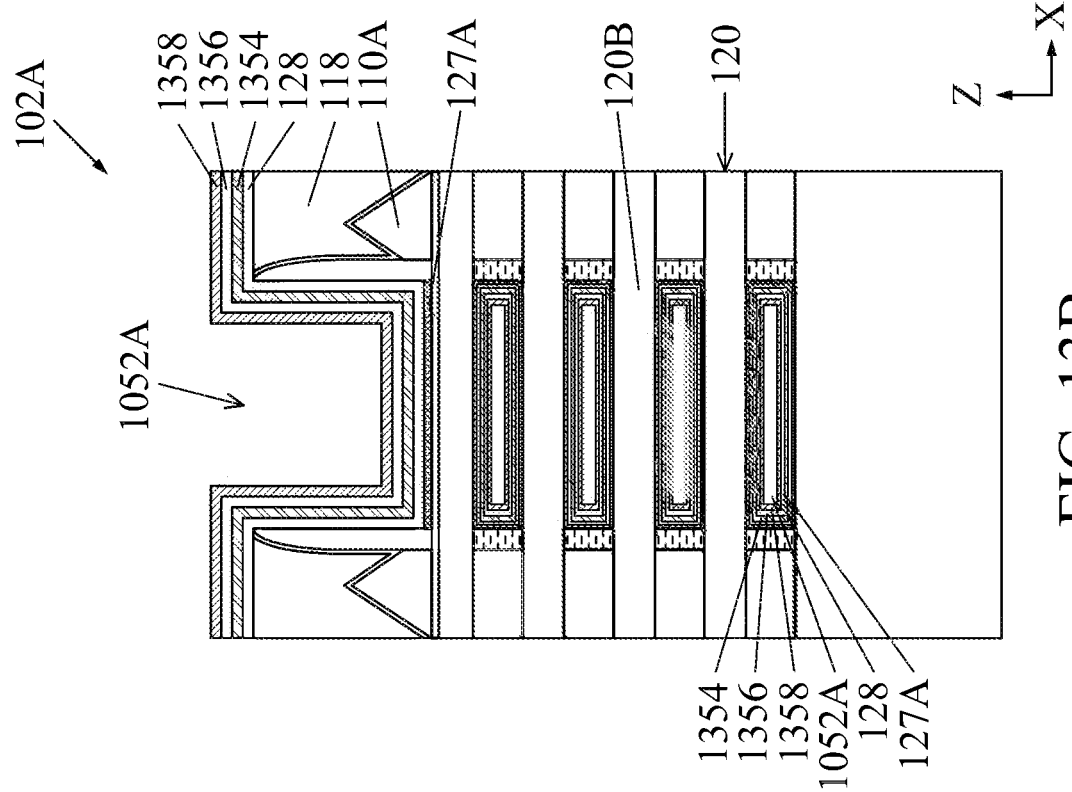
Figure 13A:
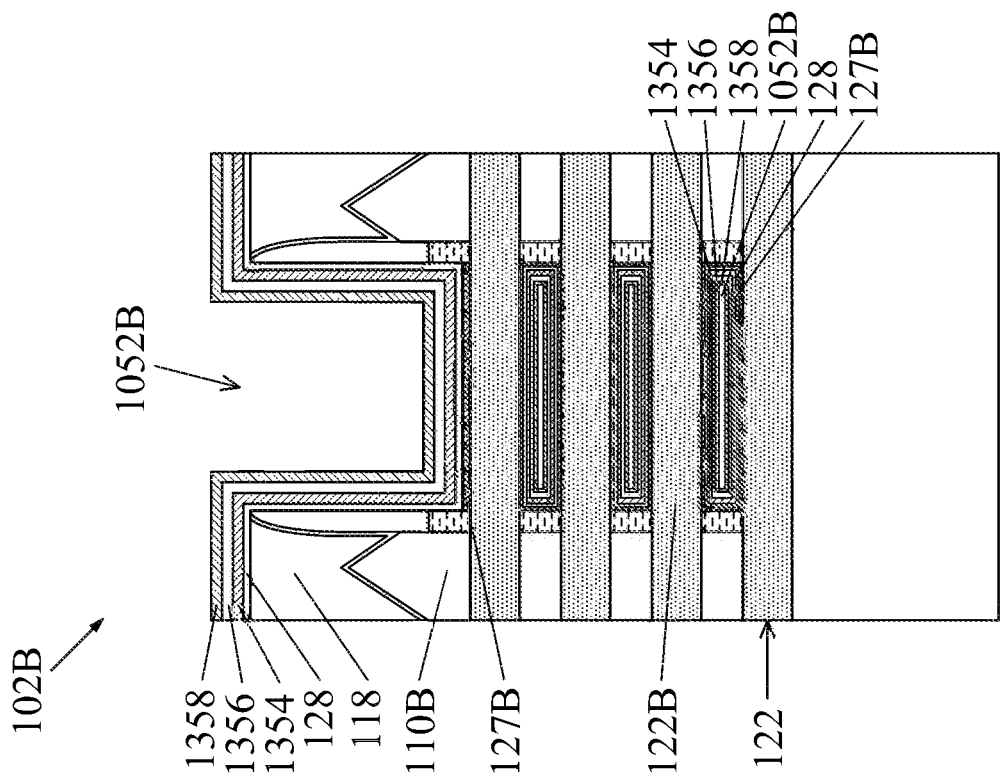

The deposition of gate dielectric layer 128 can include blanket depositing gate dielectric layer 128 on the partial semiconductor device 100 (not shown) formed after the formation of interfacial oxide layers 127A-127B. The blanket deposited gate dielectric layer 128 can be substantially conformally deposited on interfacial oxide layers 127A-127B and the exposed surfaces of the partial semiconductor device 100 (e.g., sidewalls of gate openings 1052A-1052B and top surfaces of ILD 118), as shown in FIGS. 13A-13B. In some embodiments, gate dielectric layer 128 can include a dielectric material with a dielectric constant (k-value) higher than about 3.9. In some embodiments, gate dielectric layer 128 can include (i) silicon oxide, silicon nitride, and/or silicon oxynitride, (ii) a high-k dielectric material, such as hafnium oxide ($HfO_2$), $TiO_2$, $HfZrO$, $Ta_2O_3$, $HfSiO_4$, $ZrO_2$, $ZrSiO_2$, (iii) a high-k dielectric material having oxides of Li, Be, Mg, Ca, Sr, Sc, Y, Zr, Al, La, Ce, Pr, Nd, Sm, Eu, Gd, Tb, Dy, Ho, Er, Tm, Yb, or Lu, or (iv) a combination thereof. Gate dielectric layer 128 with high-k dielectric layer (e.g., $HfO_2$) can be formed by ALD and/or other suitable methods. In some embodiments, gate dielectric layer 128 can be formed with ALD using hafnium chloride ($HfCl_4$) as a precursor at a temperature ranging from about 250° C. to about 350° C. In some embodiments, gate dielectric layer 128 can have a thickness ranging from about 1 nm to about 3 nm in order to wrap around nanostructures channel regions 120B and 122B without being constrained by spacing between adjacent nanostructured channel regions 120B and between adjacent nanostructured channel regions 122B.

The formation of interfacial oxide layers 127A-127B and gate dielectric layer 128 can be followed by a three-stage annealing process to barrier layer (not shown) on gate dielectric layer 128 and to improve the electrical characteristics and/or reliability of interfacial oxide layers 127A-127B and/or gate dielectric layer 128. The first-stage annealing process can include sequential steps of (i) blanket depositing a metal nitride capping layer 1354 (FIGS. 13A-13B) on gate dielectric layer 128, (ii) in-situ blanket depositing a Si capping layer 1356 on metal nitride capping layer 1354, and (iii) performing a first spike annealing process on the partial semiconductor device 100 (not shown) formed after the in-situ blanket deposition of Si capping layer 1356.

In some embodiments, metal nitride capping layer 1354 can include TiSiN or TiN and can be deposited by an ALD or a CVD process using titanium tetrachloride (TiCl$_4$), silane (SiH$_4$), and ammonia (NH$_3$) as precursors at a temperature ranging from about 400° C. to about 500° C. Metal nitride capping layer 1354 can have a thickness ranging from about 1 nm to about 3 nm and can react with gate dielectric layer 128 during subsequent first and/or second spike annealing processes (described below) to form a barrier layer (not shown) on gate dielectric layer 128. In some embodiments, the barrier layer can include hafnium titanium silicate (HfTi-SiO$_x$) with a thickness ranging from about 1 nm to about 3 nm. The barrier layer can be configured to prevent diffusion of elements (e.g., metals and oxygen) into interfacial oxide layers 127A-127B and/or gate dielectric layer 128 from overlying layers during subsequent processing.

The in-situ blanket deposition of Si capping layer 1356 can include an ALD, a CVD, or a PVD process. In some embodiments, the in-situ blanket deposition of Si capping layer 1356 can include a soaking process with TiCl$_4$ and SiH$_4$ gases at a temperature ranging from about 400° C. to about 500° C. The soaking process can include flowing TiCl$_4$ gas for a time period ranging from about 80 seconds to about 100 seconds and then flowing SiH$_4$ gas for a time period ranging from about 100 seconds to about 200 seconds on the surfaces of metal nitride capping layer 1354. In some embodiments, Si capping layer 1356 can include Si or its compound and/or can include amorphous or polycrystalline Si. Si capping layer 1356 can prevent oxidation of interfacial oxide layers 127A-127B and/or gate dielectric layer 128 and as a result, prevent additional growth of interfacial oxide layers 127A-127B and/or gate dielectric layer 128 during subsequent annealing processes and/or ex-situ processes.

The first spike annealing process can include performing an annealing process on the partial semiconductor device 100 (not shown) formed after the deposition of Si capping layer 1356 in a nitrogen ambient at an annealing temperature ranging from about 850° C. to about 900° C. for a time period ranging from about 1 second to about 5 seconds. According to some embodiments, the first spike annealing process can strengthen the chemical bonds at the interface between interfacial oxide layers 127A-127B and gate dielectric layer 128 to improve the reliability of interfacial oxide layers 127A-127B and/or gate dielectric layer 128, and consequently, improve the reliability of gate structures 112A-112B.

The second-stage annealing process can include sequential steps of (i) ex-situ blanket depositing a Si capping layer 1358 (FIGS. 13A-13B) on Si capping layer 1356 after the first spike annealing process and (ii) performing a second spike annealing process on the partial semiconductor device 100 (not shown) formed after the ex-situ blanket deposition of Si capping layer 1358.

The ex-situ blanket deposition of Si capping layer 1358 can include an ALD, a CVD, or a PVD process. In some embodiments, the ex-situ blanket deposition of Si capping layer 1358 can include depositing a silicon-based layer on Si capping layer 1356 by a CVD process using SiH$_4$, disaline (Si$_2$H$_6$), and hydrogen at a temperature ranging from about 350° C. to about 450° C. Si capping layer 1358 can be deposited with a thickness (e.g., about 2 nm to about 5 nm) about 2 to about 5 times greater than the thickness of Si capping layer 1356. The thicker Si capping layer 1358 can prevent oxidation of interfacial oxide layers 127A-127B and/or gate dielectric layer 128 during the subsequent second annealing process, which is performed at a temperature higher than that of the first spike annealing process. The second spike annealing process can be performed in a nitrogen ambient at an annealing temperature ranging from about 900° C. to about 950° C. for a time period ranging from about 1 second to about 10 seconds.

Figure 14B:
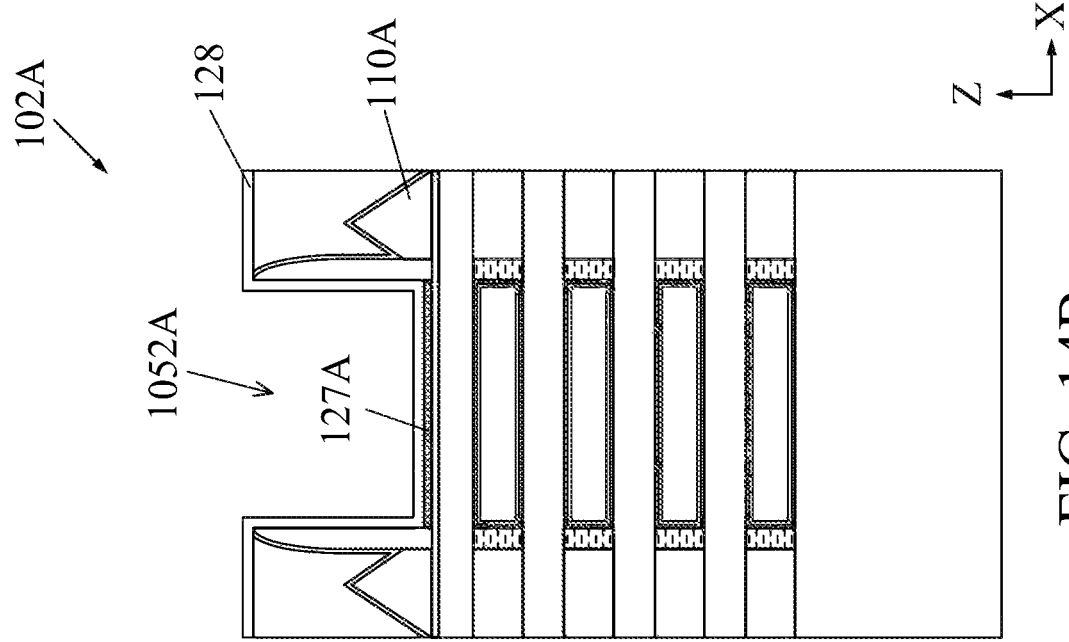
Figure 14A:
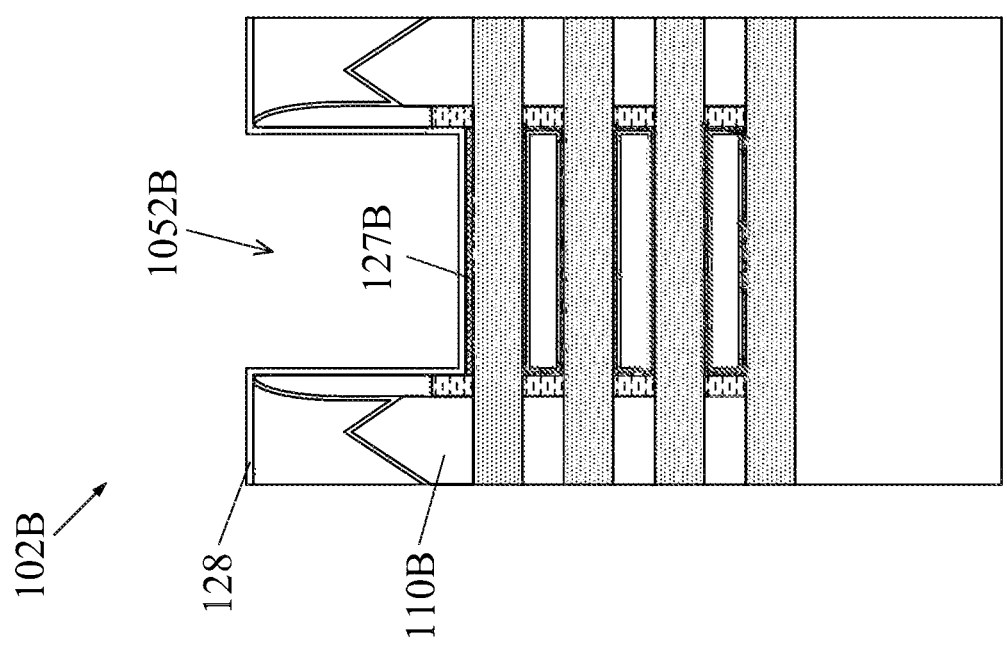

The third-stage annealing process can include sequential steps of (i) removing metal nitride layer 1354, in-situ Si capping layer 1356, and ex-situ Si capping layer 1358 after the second spike annealing process (FIGS. 14A-14B) and (ii) performing a third spike annealing process on the structures of FIGS. 14A-14B. Metal nitride layer 1354, in-situ Si capping layer 1356, and ex-situ Si capping layer 1358 can be removed by a wet etching process. In some embodiments, the wet etching process can include etching in DHF, KOH solution, SC1 solution, or a combinations thereof. The third spike annealing process can be performed in an NH$_3$ ambient at an annealing temperature ranging from about 850° C. to about 950° C. The third spike annealing process can incorporate nitrogen into gate dielectric layer 128 to remove defects, such as oxygen vacancies from gate dielectric layer 128 and as a result, improve the reliability of gate structures 112A-112B (shown in FIG. 1A). In some embodiments, the annealing temperatures of the first and third spike annealing processes can be similar to or different from each other. In some embodiments, the annealing temperature of the second spike annealing process can be higher than the annealing temperatures of the first and third spike annealing processes.

Referring to FIG. 3, in operation 330, a pWFM layer is selectively formed on the nanostructured channel regions of the PFET. For example, a pWFM layer 130B* can be selectively formed on nanostructured channel regions 122B of FET 102B, as described with reference to FIGS. 15A-16B. During subsequent processing, pWFM layer 130B* can form pWFM layer 130B as shown in FIGS. 1A-1C. The process for selectively forming pWFM layer 130B* on nanostructured channel regions 122B can include sequential steps of (i) blanket depositing pWFM layer 130B* (FIGS. 15A-15B) on the structures of FIGS. 14A-14B after the third spike annealing process, (ii) selectively forming a masking layer 1560 (e.g., a photoresist layer or a nitride layer) on the portion of pWFM layer 130B* of FET 102B as shown in FIG. 15A, (iii) selectively removing portions of pWFM layer 130B* of FET 102A to form the structure of FIG. 16B, and (v) removing masking layer 1560.

The blanket deposition of pWFM layer 130B* can include blanket depositing about 1 nm to about 3 nm thick Al-free pWFM layer with an ALD or a CVD process using titanium tetrachloride (TiCl$_4$) and NH$_3$ as precursors at a temperature ranging from about 350° C. to about 475° C. In some embodiments, the Al-free pWFM layer can be deposited in an ALD process of about 30 cycles to about 90 cycles, where one cycle can include sequential periods of: (i) first precursor gas (e.g., TiCl$_4$) flow, (ii) a first gas purging process, (iii) a second precursor gas (e.g., NH$_3$) gas flow, and (iv) a second gas purging process. In some embodiments, the Al-free pWFM layer can include substantially Al-free (e.g., with no Al) Ti-based nitrides or alloys. The blanket deposited pWFM layer 130B* can be substantially conformally deposited (e.g., step coverage of about 99%) on the structures of FIGS. 14A-14B.

Figures 15A, 15B:
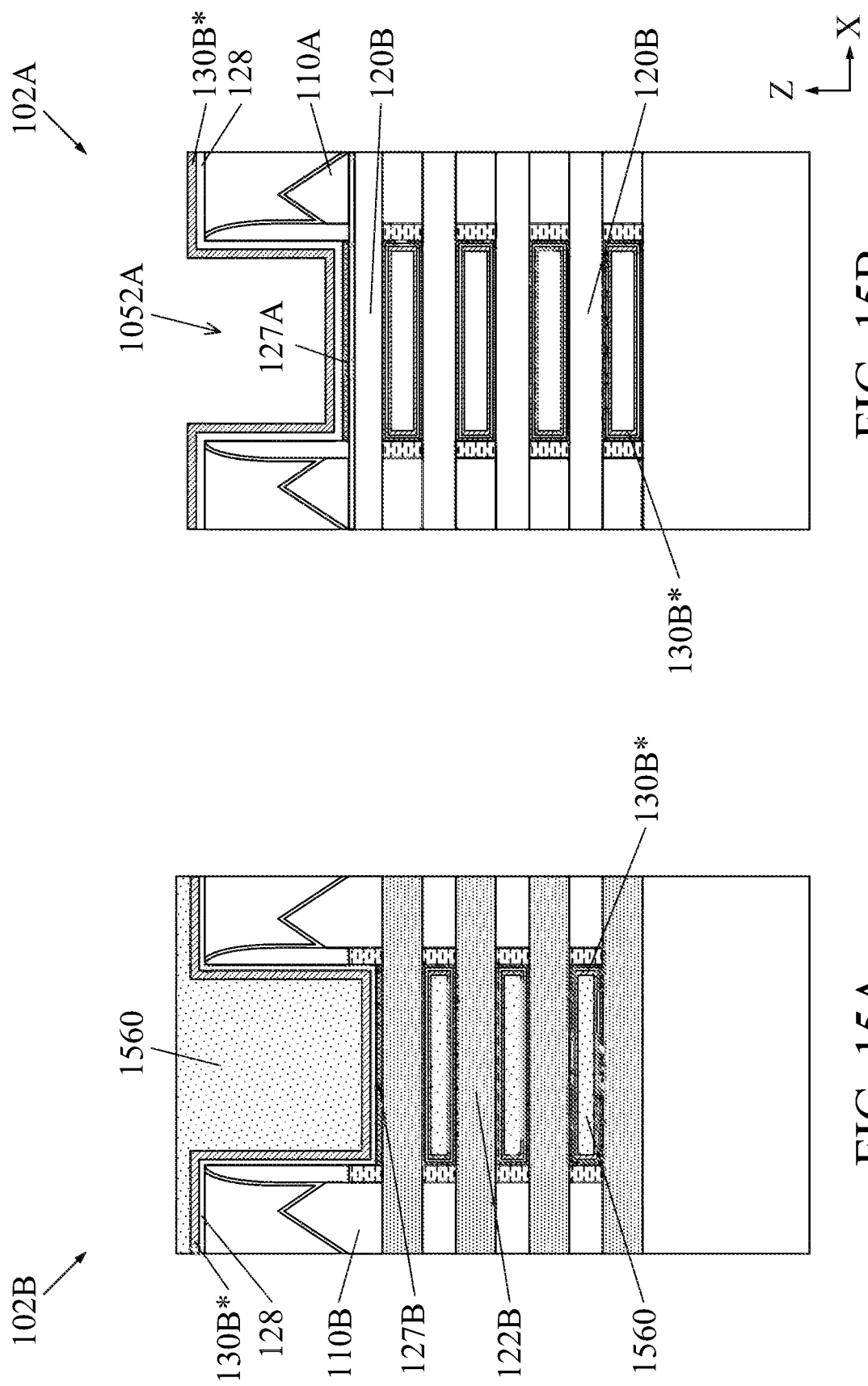

The selective formation of masking layer 1560 can include depositing and patterning a layer of photoresist or nitride on pWFM layer 130B* to form the structures of FIGS. 15A-15B. The selective removal of the portions of pWFM layer 130B* not protected by masking layer 1560 can include a wet etching process using etchants with a higher etch selectivity for pWFM layer 130B* than masking layer 1560. In some embodiments, the etchants can include a mixture of ammonia hydroxide, hydrogen peroxide, and water (SC1 solution), and/or a mixture of hydrochloric acid, hydrogen peroxide, water (SC2 solution) and the etching time period can be about 2 min to about 5 min. Masking layer 1560 can be removed after the wet etching process.

Referring to FIG. 3, in operation 335, a metal growth inhibition layer is selectively deposited on the pWFM layer. For example, a metal growth inhibition layer 131* can be selectively deposited on pWFM layer 130B* as described with reference to FIGS. 16A-16B. During subsequent processing, the metal growth inhibition layer 131* can form metal growth inhibition layer 131, as shown in FIGS. 1A-1C. The selective deposition of metal growth inhibition layer 131* can include sequential steps of (i) performing a first soaking process with a metal precursor on the partial semiconductor device 100 (not shown) formed after the formation of pWFM layer 130B* and (ii) performing a second soaking process with a Si precursor to form the structure of FIG. 16A. The first and second soaking processes can be in-situ processes.

The first soaking process can include flowing the metal precursor (e.g., $TiCl_4$ gas) for a time period ranging from about 80 seconds to about 100 seconds in an ALD or a CVD chamber at a temperature ranging from about 300° C. to about 500° C. and a pressure ranging from about 3 torr to about 30 torr. The metal precursor can have a higher deposition selectivity on metal surfaces (such as pWFM layer 130B*) than on dielectric surfaces (such as the portion of gate dielectric layer 128 of NFET 102A (FIG. 16B)) such that no substantial thickness of metal layer (e.g., thickness about 0 nm) can be deposited on gate dielectric layer 128 and about 0.1 nm to about 0.5 nm thick metal layer (e.g., Ti layer) can be deposited on pWFM layer 130B* during the first soaking process.

Figure 16A:
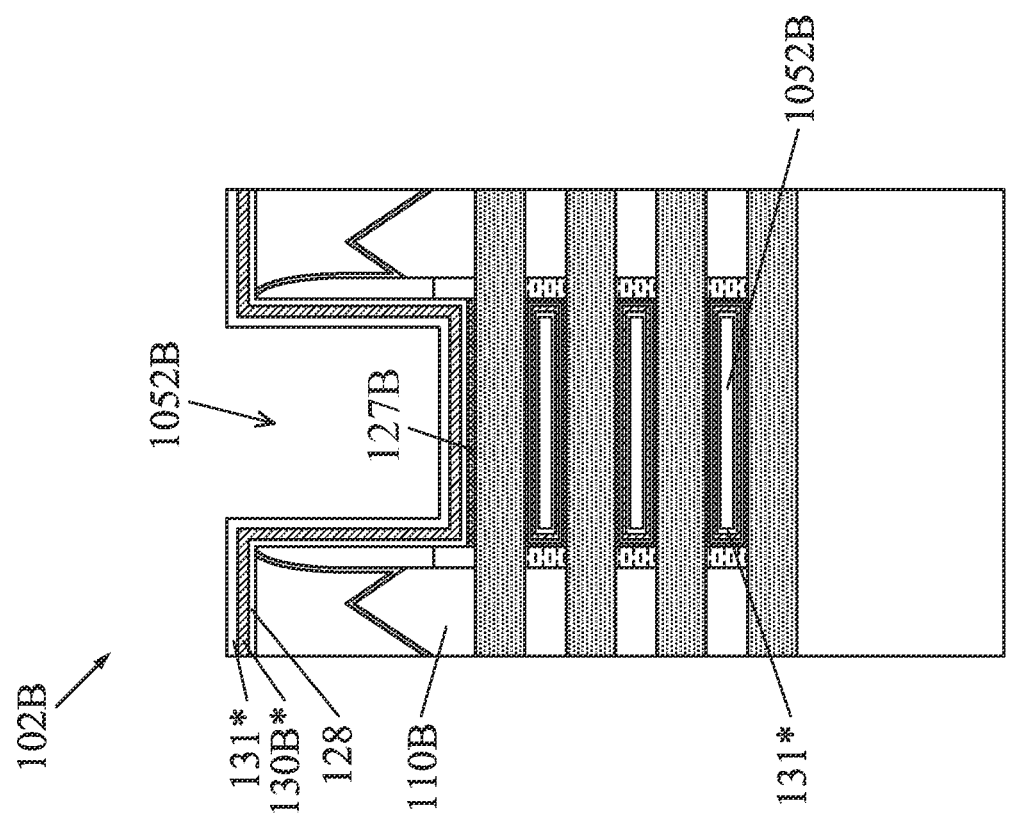
Figure 16B:
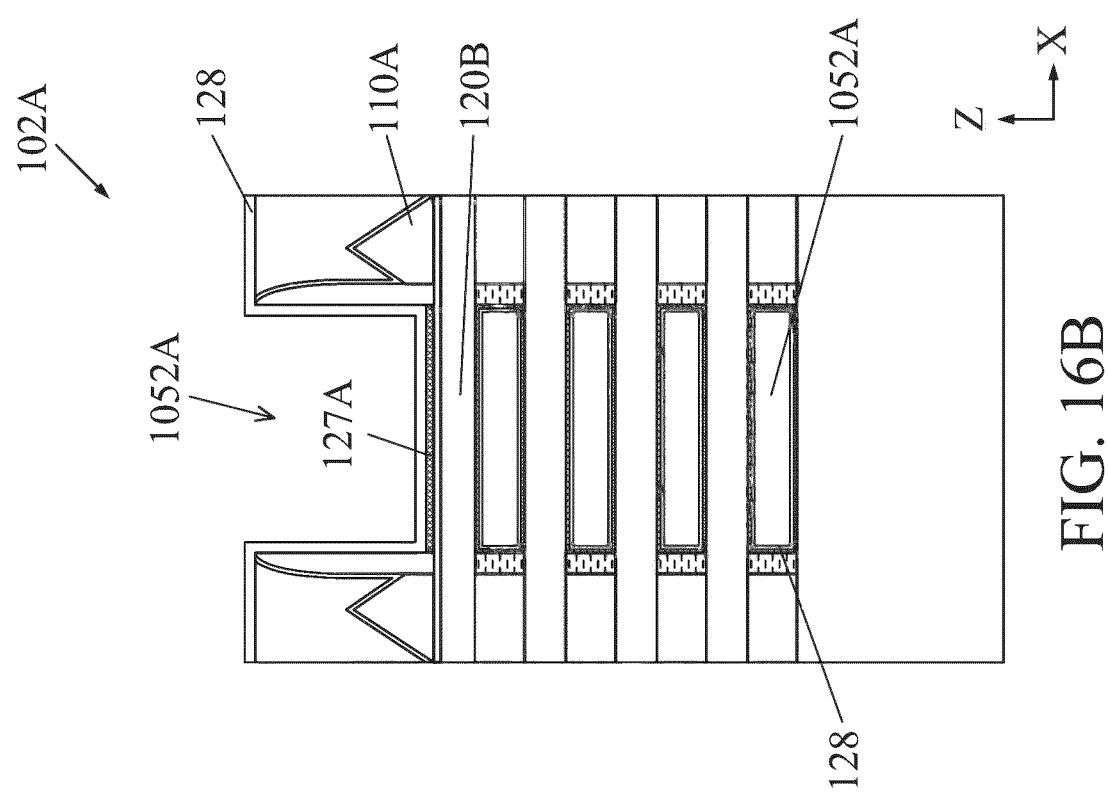

The second soaking process can include flowing the Si precursor (e.g., $SiH_4$ gas) for a time period ranging from about 4 min to about 6 min in the ALD or a CVD chamber at a temperature ranging from about 300° C. to about 500° C. and a pressure ranging from about 3 torr to about 30 torr. The Si precursor can have a higher deposition selectivity on the metal layer on pWFM layer 130B* than on the portion of gate dielectric layer 128 of NFET 102A (FIG. 16B). As a result, no substantial thickness of metal growth inhibition layer 131* layer (e.g., thickness about 0 nm) can be deposited on gate dielectric layer 128 (FIG. 16B) and about 0.5 nm to about 2 nm thick metal growth inhibition layer 131* (FIG. 16A) can be deposited on pWFM layer 130B* during the second soaking process. The selectively deposited metal growth inhibition layer 131* can be substantially conformally deposited (e.g., step coverage of about 99%) on pWFM layer 130B* as shown in FIG. 16A.

Figure 17B:
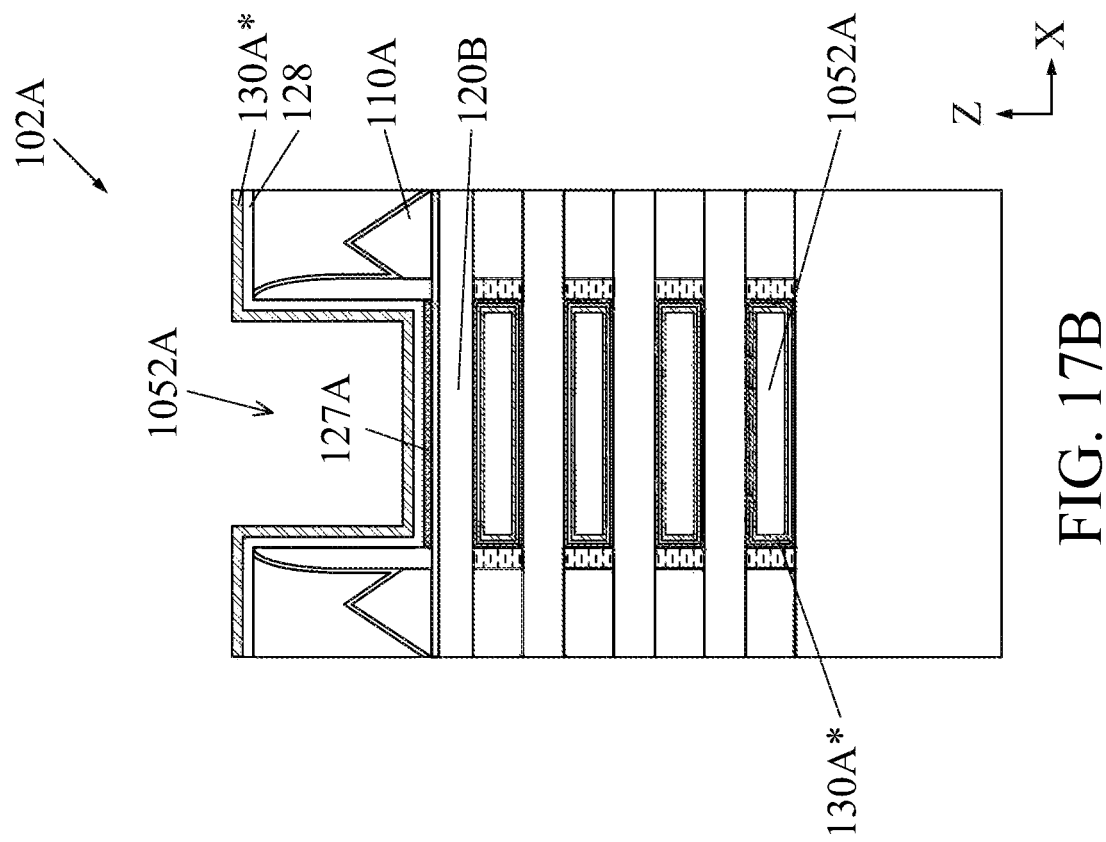
Figure 17A:
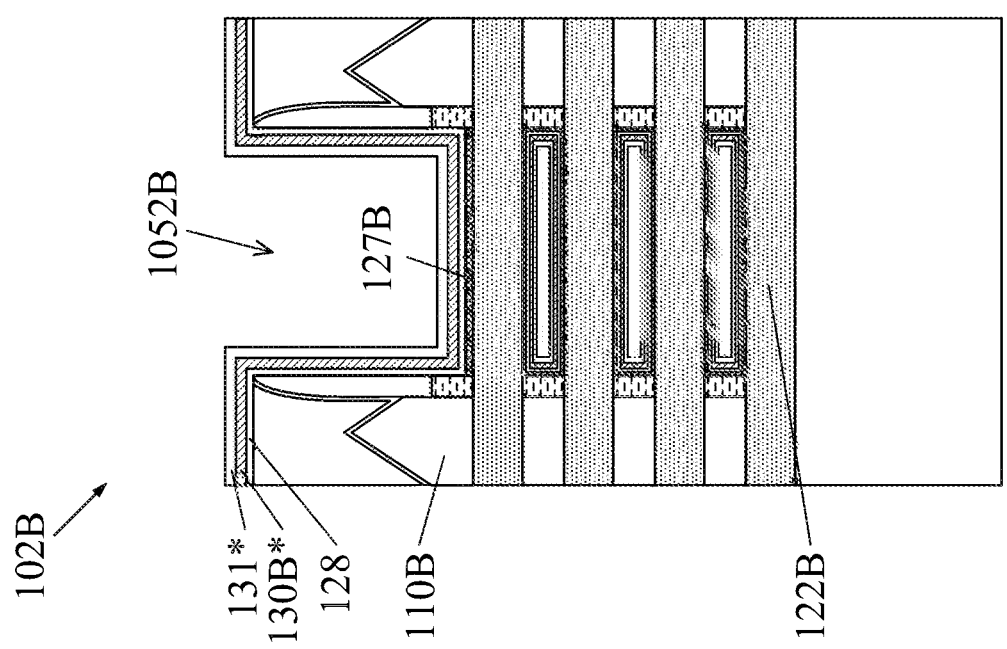

Referring to FIG. 3, in operation 340, an nWFM layer is selectively deposited on a portion of the gate dielectric layer of the NFET. For example, an nWFM layer 130A* can be selectively deposited on the portion of gate dielectric layer 128 of FET 102A, as described with reference to FIGS. 17A-17B. During subsequent processing, nWFM layer 130A* can form nWFM layer 130A as shown in FIGS. 1A-1B and 1D. The process for selectively depositing nWFM layer 130A* can include performing an ALD or a CVD process with metal and Al precursors on the structures of FIGS. 16A-16B. The metal and Al precursors can have a higher deposition selectivity on gate dielectric layer 128 than on metal growth inhibition layer 131*. As a result, no substantial thickness of Al-based nWFM layer 130A* (e.g., thickness about 0 nm) can be deposited on metal growth inhibition layer 131* layer (FIG. 17A) and about 1 nm to about 3 nm thick Al-based nWFM layer 130A* can be deposited on gate dielectric layer 128 (FIG. 17B) during the ALD or CVD process. The selectively deposited Al-based nWFM layer 130A* can be substantially conformally deposited (e.g., step coverage of about 99%) on gate dielectric layer 128 as shown in FIG. 17B.

In some embodiments, the process for selectively depositing nWFM layer 130A* can include performing the ALD or CVD process with titanium tetrachloride ($TiCl_4$) and titanium ethylene aluminum (TEAl) or tantalum chloride (TaCl5) and trimethylaluminium (TMA) as precursors at a temperature ranging from about 350° C. to about 450° C. In some embodiments, nWFM layer 130A* can be deposited in an ALD process of about 4 cycles to about 12 cycles, where one cycle can include sequential periods of: (i) first precursor gas (e.g., $TiCl_4$ or $TaCl_5$) flow, (ii) a first gas purging process, (iii) a second precursor gas (e.g., TEAl or TMA) gas flow, and (iv) a second gas purging process. In some embodiments, nWFM layer 130A* can include titanium aluminum (TiAl), titanium aluminum carbide (TiAlC), tantalum aluminum (TaAl), tantalum aluminum carbide (TaAlC), or a combination thereof. In some embodiments, instead of selectively depositing Al-based nWFM layer 130A*, a metallic layer (e.g., TiN, TiC, TaN, and TaC) can be selectively deposited on the portion of gate dielectric layer 128 of FET 102A in an ALD or CVD process with a metal precursor followed by a doping process with Al dopants to form nWFM layer 130A*.

Referring to FIG. 3, in operation 345, a metal capping layer and a gate metal fill layer are deposited on the nWFM and pWFM layers. For example, a metal capping layer 132 can be deposited on nWFM and pWFM layers **130A*130B* and a gate metal fill layer 135 can be deposited on metal capping layer 132 as described with reference to FIGS. 18A-18B. During subsequent processing, metal capping layer 132 and gate metal fill layer 135 can form metal capping layers 132A-132B and gate metal fill layers 135A-135B, respectively, as shown in FIGS. 1A-1D**.

The deposition of metal capping layer 132 can include blanket depositing an Al-free metallic layer, such as Ti, TiN, TiSiN, Ta, TaN, TaSiN, WN, WCN, other suitable metal nitrides, metal alloys, or a combination thereof on nWFM and pWFM layers **130A*130B*. The blanket deposition of the metallic layer can include blanket depositing about 1 nm to about 3 nm thick metallic layer with an ALD or a CVD process using a metal precursor (e.g., titanium tetrachloride ($TiCl_4$)) and $NH_3$ at a temperature ranging from about 350° C. to about 475° C. In some embodiments, the metallic layer can be deposited in an ALD process of about 30 cycles to about 90 cycles, where one cycle can include sequential periods of: (i) first precursor gas (e.g., $TiCl_4$) flow, (ii) a first gas purging process, (iii) a second precursor gas (e.g., $NH_3$) gas flow, and (iv) a second gas purging process. The blanket deposited metal capping layer 132 can be substantially conformally deposited (e.g., step coverage of about 99%) on the structures of FIGS. 17A-17B**.

Figure 18B:
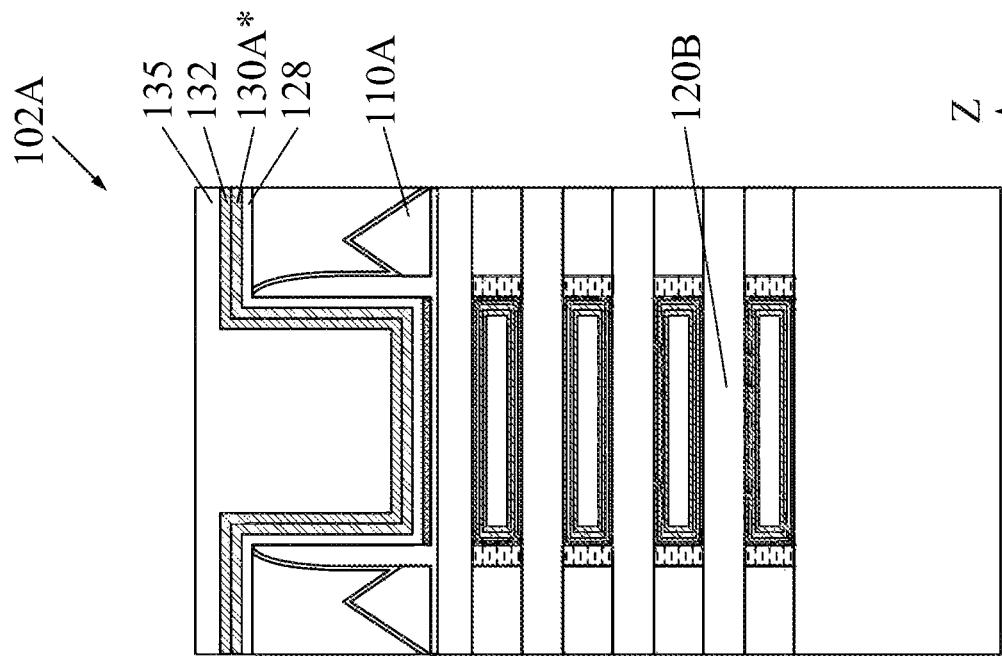
Figure 18A:
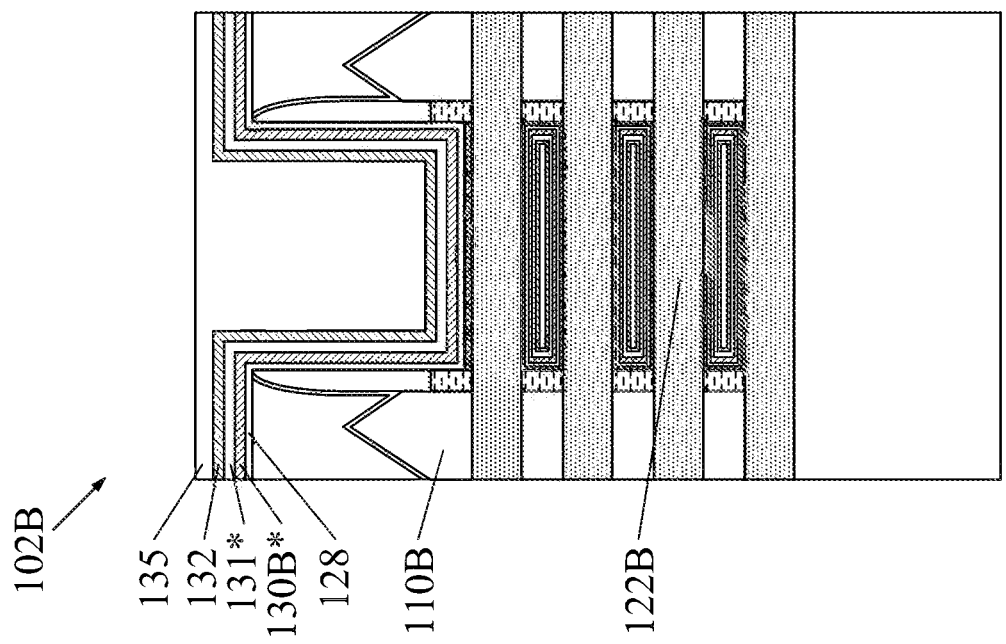

The deposition of metal capping layer 132 can be followed by the deposition of gate metal fill layer 135 on metal capping layer 132 until gate openings 1052A-1052B are filled as shown in FIGS. 18A-18B. The deposition of gate metal fill layer 135 can include blanket depositing about 150 nm to about 200 nm thick metal layer in a CVD process with $O_2$ and a fluorine- and/or chlorine-free metal precursors, such as organometallic precursors (e.g., $Ru(DMBD)(CO)_3$ or $Ir(acac)_3$) at a temperature ranging from about 225° C. to about 400° C.

Referring to FIG. 3, in operation 350, the gate dielectric layer, pWFM layer, nWFM layer, metal growth inhibition layer, metal capping layer, and gate metal fill layer are polished. For example, gate dielectric layer 128, nWFM and pWFM layers 130A*-130B*, metal growth inhibition layer 131*, metal capping layer 132, and gate metal fill layer 135 can be polished by a chemical mechanical polishing process to substantially coplanarize top surfaces of gate dielectric layer 128, nWFM and pWFM layers 130A*-130B*, metal growth inhibition layer 131*, metal capping layer 132, and gate metal fill layer 135 with top surface of ILD layer 118 as shown in FIGS. 1A-1D. As a result of the polishing process, gate structures 112A-112B can be formed as shown in FIGS. 1A-1D. Thus, as described in operations 325-350, gate structures 112A-112B can be formed using a pWFM-first scheme in which Al-free pWFM layer (e.g., pWFM layer 130B*) can be formed prior to the formation of Al-based nWFM layers (e.g., nWFM layers 130A*) to prevent or substantially reduce contamination of the Al-free pWFM layers with Al from the Al-based nWFM layer.

The formation of gate structures 112A-112B can be followed by formation of other elements such as S/D contacts, gate contacts, vias, interconnect metal layers, dielectric layers, passivation layers, etc., which are not shown for the sake of clarity.

The present disclosure provides example structures of FETs (e.g., FETs 102A-102B) with different gate structures (e.g., gate structures 112A-112B) configured to provide ultra-low threshold voltages and example methods of forming such FETs on the same substrate (e.g., substrate 106). The example methods form FETs of different conductivity types with different work function values, and as a result, the FETs have different and/or ultra-low threshold voltages. These example methods can be less complicated and more cost-effective in manufacturing reliable gate structures in FETs with nanostructured channel regions and with ultra-low threshold voltages than other methods of forming FETs with similar channel dimensions and threshold voltages on the same substrate. In addition, these example methods can form FET gate structures with smaller dimensions (e.g., thinner gate stacks) than other methods of forming FETs with similar threshold voltages. For example, using these example methods, the thicknesses of gate stack layers can be reduced by about 50% to about 75% compared to the thicknesses of gate stack layers formed using the other methods.

In some embodiments, NFETs (e.g., FET 102A) and PFETs (e.g., FET 102B) with different gate stack layer configurations can be selectively formed on the same substrate. To achieve NFETs and PFETs with ultra-low threshold voltages, NFETs and PFETs can include Al-based NFET gate stacks and substantially Al-free (e.g., with no Al) PFET gate stacks, respectively. The NFET and PFET gate stacks can have nWFM layers (e.g., nWFM layer 130A) and pWFM layers (e.g., pWFM layer 130B) in physical contact with gate dielectric layers (e.g., gate dielectric layers 128A-128B) of the NFETs and PFETs, respectively. The NFET gate stacks can include Al-based nWFM layers (e.g., Al-based titanium (Ti) or tantalum (Ta) alloys) and the PFET gate stacks can include substantially Al-free (e.g., with no Al) pWFM (e.g., Al-free Ti or Ta nitrides or alloys) with thicknesses smaller than 3 nm (e.g., about 0.5 nm to about 3 nm) to achieve ultra-low threshold voltages. In some embodiments, PFET gate stacks can have metal growth inhibition layers (e.g., metal growth inhibition layer 131) configured to inhibit the deposition of Al-based layers in PFET gate stacks during the formation of the Al-based nWFM layers in NFET gate stacks. As such, the inhibition layers can prevent the PFET gate stacks from being contaminated with Al atoms, which can decrease the work function values of the pWFM layers and increase PFET threshold voltage. In some embodiments, the NFET gate structures can have metal capping layers on the Al-based nWFM layers. The metal capping layers can prevent the oxidation of the Al-based nWFM layers and as a result, prevent an increase in work function values of the Al-based nWFM layers and an increase in NFET threshold voltage.

In some embodiments, a semiconductor device includes a substrate, first and second stacks of first and second nanostructured layers arranged in an alternating configuration on the substrate, first and second epitaxial regions of opposite conductivity type on the first and second stacks, respectively, first and second nanostructured channel regions in the first and second nanostructured layers of the first and second stacks, respectively, and first and second gate-all-around (GAA) structures surrounding the first and second nanostructured channel regions, respectively. The first GAA structure comprises an Al-based gate stack with a first gate dielectric layer, an Al-based n-type work function metal layer, a first metal capping layer, and a first gate metal fill layer. The second GAA structure includes an Al-free gate stack with a second gate dielectric layer, an Al-free p-type work function metal layer, a metal growth inhibition layer, a second metal capping layer, and a second gate metal fill layer.

In some embodiments, a semiconductor device includes a substrate, first and second stacks of first and second nanostructured layers arranged in an alternating configuration on the substrate, first and second nanostructured channel regions in the first and second nanostructured layers of the first and second stacks, respectively, a first gate structure disposed on the first nanostructured channel region, and a second gate structure disposed on the second nanostructured channel region. The first gate structure includes an Al-based gate stack with a first gate dielectric layer, an Al-based n-type work function metal layer, a first metal capping layer, and a first gate metal fill layer. The second gate structure includes an Al-free gate stack with a second gate dielectric layer, an Al-free p-type work function metal layer, a metal growth inhibition layer, a second metal capping layer, and a second gate metal fill layer.

In some embodiments, a method of fabricating a semiconductor device includes forming first and second stacks of first and second nanostructured layers arranged in an alternating configuration on a substrate, forming first and second nanostructured channel regions in the first and second nanostructured layers of the first and second stacks, respectively, selectively forming an Al-free p-type work function metal layer on the first nanostructured channel regions, selectively depositing a metal growth inhibition layer on the Al-free p-type work function metal layer, selectively depositing an Al-based n-type work function metal layer on the second nanostructured channel regions, depositing a metal capping layer on the Al-free p-type work function metal layer and the Al-based n-type work function metal layer, and depositing a fluorine- or chlorine-free gate metal fill layer on the metal capping layer.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a substrate;
a fin structure disposed on the substrate;
a stack of nanostructured layers disposed on the fin structure;
an epitaxial region surrounding first portions of the nanostructured layers; and
a gate-all-around (GAA) structure surrounding second portions of the nanostructured layers,
wherein the GAA structure comprises a gate dielectric layer, a work function metal layer, a silicon-based metal growth inhibition layer, and a gate metal fill layer.

2. The semiconductor device of claim 1, wherein the work function metal layer comprises an aluminum (Al)-free material.

3. The semiconductor device of claim 1, wherein the silicon-based metal growth inhibition layer is disposed between the work function metal layer and the gate metal fill layer.

4. The semiconductor device of claim 1, wherein the silicon-based metal growth inhibition layer is in physical contact with the work function metal layer.

5. The semiconductor device of claim 1, wherein the silicon-based metal growth inhibition layer comprises a higher deposition selectivity on a metal surface than on a dielectric surface.

6. The semiconductor device of claim 1, wherein the silicon-based metal growth inhibition layer comprises an amorphous silicon or a polycrystalline silicon.

7. The semiconductor device of claim 1, wherein the silicon-based metal growth inhibition layer comprises a thickness ranging from about 0.5 nm to about 2 nm.

8. The semiconductor device of claim 1, wherein the work function metal layer is in physical contact with the gate dielectric layer.

9. The semiconductor device of claim 1, further comprising a metal capping layer disposed between the silicon-based metal growth inhibition layer and the gate metal fill layer.

10. The semiconductor device of claim 1, wherein the work function metal layer has a work function value closer to a valence band energy than a conduction band energy of the nanostructured layers.

11. The semiconductor device of claim 1, further comprising an oxygen diffusion barrier layer disposed between the silicon-based layer and the gate metal fill layer.

12. A semiconductor device, comprising:
a substrate;
a fin structure disposed on the substrate;
a source/drain region disposed on the fin structure;
nanostructured channel regions disposed on the fin structure and adjacent to the source/drain region; and
a gate structure surrounding nanostructured channel regions, wherein the gate structure comprises:
an oxide layer surrounding the nanostructured channel regions;
a gate dielectric layer disposed on the oxide layer;
a p-type work function metal layer disposed on the gate dielectric layer;
a silicon-based layer disposed on the p-type work function metal layer; and
a gate metal fill layer.

13. The semiconductor device of claim 12, wherein the p-type work function metal layer comprises an aluminum (Al)-free metal.

14. The semiconductor device of claim 12, wherein the silicon-based layer comprises an amorphous silicon layer or a polycrystalline silicon layer.

15. A semiconductor device, comprising:
a substrate;
first and second nanostructured layers disposed on the substrate;
first and second source/drain regions surrounding the first and second nanostructured layers, respectively; and
first and second gate structures surrounding the first and second nanostructured layers, respectively,
wherein the first gate structure comprises a first gate dielectric layer, a silicon-based layer, a p-type work function metal layer, and a first gate metal fill layer, and
wherein the second gate structure comprises a second gate dielectric layer, an n-type work function metal layer, and a second gate metal fill layer.

16. The semiconductor device of claim 15, wherein the p-type work function metal layer comprises an aluminum (Al)-free material, and wherein the n-type work function metal layer comprises an Al-based material.

17. The semiconductor device of claim 15, wherein the silicon-based layer comprises a thickness ranging from about 0.5 nm to about 2 nm.

18. The semiconductor device of claim 15, wherein the silicon-based layer comprises an amorphous silicon layer or a polycrystalline silicon layer.

19. The semiconductor device of claim 15, further comprising a metal capping layer disposed between the silicon-based layer and the first gate metal fill layer.

20. The semiconductor device of claim 15, further comprising an oxygen diffusion barrier layer disposed between the n-type work function metal layer and the second gate metal fill layer.

* * * * *